United States Patent [19]
Chang

[11] Patent Number: 5,761,121
[45] Date of Patent: Jun. 2, 1998

[54] PMOS SINGLE-POLY NON-VOLATILE MEMORY STRUCTURE

[75] Inventor: Shang-De Ted Chang, Fremont, Calif.

[73] Assignee: Programmable Microelectronics Corporation, San Jose, Calif.

[21] Appl. No.: 744,699

[22] Filed: Oct. 31, 1996

[51] Int. Cl.$^6$ ........................................ G11C 11/34
[52] U.S. Cl. ........................ 365/185.14; 365/185.05; 365/185.29; 257/318; 257/319; 257/320
[58] Field of Search ..................... 365/185.14, 185.05, 365/185.29; 257/318, 319, 320

[56] References Cited

U.S. PATENT DOCUMENTS

| | | | |
|---|---|---|---|
| 4,404,577 | 9/1983 | Cranford, Jr. et al. | 357/23 |
| 4,425,631 | 1/1984 | Adam | 365/185 |
| 4,630,087 | 12/1986 | Momodomi | 397/23.5 |
| 5,089,433 | 2/1992 | Anand et al. | 437/40 |
| 5,309,012 | 5/1994 | Jex et al. | 257/401 |

*Primary Examiner*—David C. Nelms
*Assistant Examiner*—Hien Nguyen
*Attorney, Agent, or Firm*—Skjerven, Morrill, MacPherson, Franklin & Friel

[57] ABSTRACT

A P-channel single-poly non-volatile memory cell having P+ source and P+ drain regions and a channel extending therebetween is formed in an N-type well. An overlying polysilicon floating gate is separated from the N-well by a thin oxide layer. A P-type diffusion region is formed in a portion of the N-well underlying the floating gate and is thereby capacitively coupled to the floating gate. Within this P-type diffusion area lies an N-type diffusion area which serves as the control gate for the cell. The P-type diffusion region electrically isolates the control gate from the N-well such that voltages may be applied to the control gate in excess of those applied to the N-well without creating a current path from the control gate to the N-well. Programming is accomplished by coupling a sufficient voltage to the floating gate via the control gate while biasing the source and drain regions so as to cause the tunneling of electrons from the P+ drain region of the cell to the floating gate. In some embodiments, an additional P-type diffusion region underlying the floating gate and separated therefrom by a layer of tunnel oxide serve as an erase gate for the memory cell. In such embodiments, erasing of the cell is accomplished by causing electrons to tunnel from the floating gate to the erase gate.

19 Claims, 19 Drawing Sheets

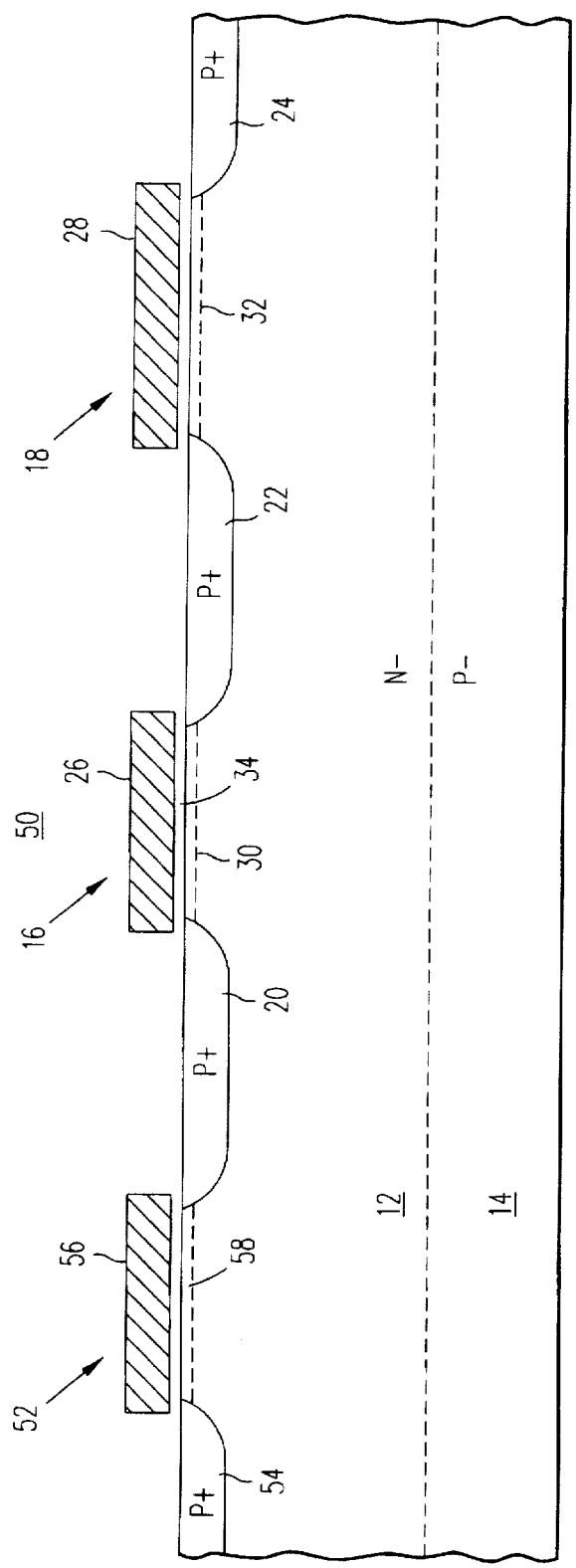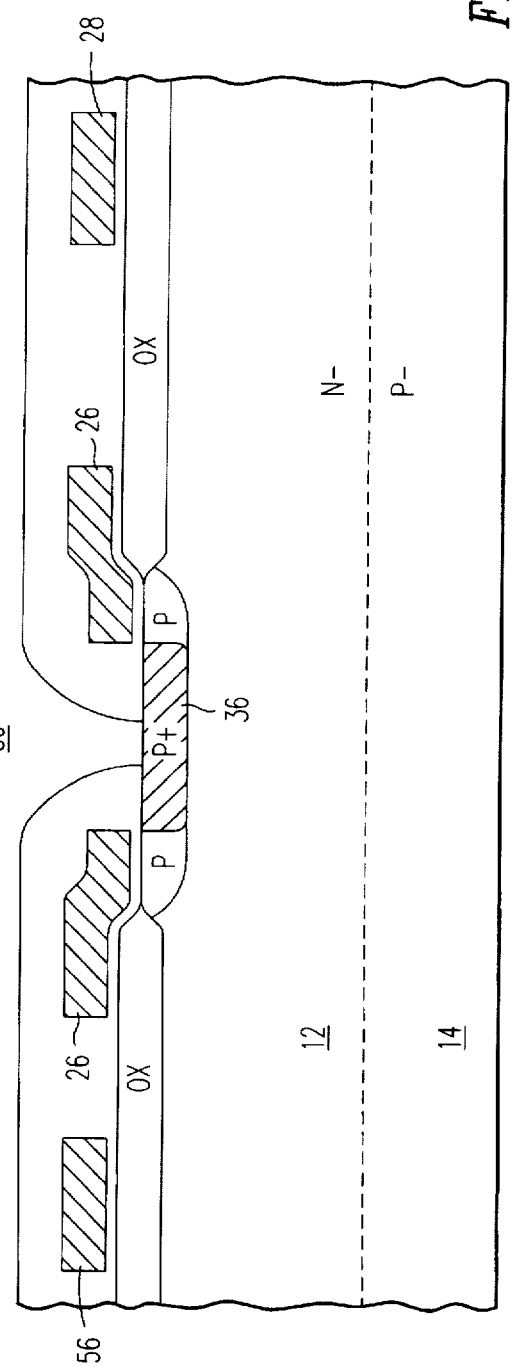

PMOS SINGLE-POLY NON-VOLATILE MEMORY STRUCTURE

CROSS-REFERENCES TO RELATED APPLICATION

This application is related to commonly owned U.S. patent application Ser. No. 08/577,405 entitled "PMOS FLASH EEPROM CELL WITH SINGLE POLY" filed on Dec. 22, 1995 which is a continuation-in-part of commonly owned U.S. patent application Ser. No. 560,249 filed Nov. 21, 1995.

BACKGROUND

1. Field of the Invention

The present invention relates generally to memory cells and specifically to a P-channel single-poly memory cell.

2. Description of Related Art

It is desirable, when embedding memory cells into a standard logic process, to do so without changing the single-poly process typically used in the fabrication of the logic circuitry. This desire has led to the development of single-poly memory cells having N+ source and N+ drain regions formed in a P-type substrate and a poly-silicon gate overlying a channel region extending between the P+ source and P+ drain regions. An N-type diffusion region formed in the P-type substrate serves as the control gate and is capacitively coupled to a floating gate via a thin oxide layer. The oxide layer has a tunnel window opened in a portion thereof near the N+ drain to facilitate electron tunneling. Since the control gate and floating gate of this single-poly cell form a capacitor in a manner similar to that of the more traditional stacked gate memory cells, the single-poly cell may be programmed, erased, and read in a manner similar to that of the double-poly cell. That is, programming is accomplished by electron tunneling from the floating gate to the substrate, while erasing is realized by electron tunneling from the substrate/drain region to the floating gate.

The above-described N-channel single-poly memory cell is disadvantageous since it requires high programming and erasing voltages which may be, for instance, as high as 20V. These high programming and erase voltages limit the extent to which the size of such memory cells may be reduced.

SUMMARY

In accordance with the present invention, a P-channel single-poly non-volatile memory cell having P+ source and P+ drain regions and a channel extending therebetween is formed in an N-type well (N-well). A thin layer of tunnel oxide is provided over the channel and, in some embodiments, over significant portions of the N-well. A poly-silicon floating gate overlies the tunnel oxide. A P-type diffusion region is formed in a portion of the N-well underlying the floating gate and is thereby capacitively coupled to the floating gate. Within this P-type diffusion region lies an N-type diffusion region which serves as the control gate for the cell. The P-type diffusion region electrically isolates the control gate from the N-well. In this manner, voltages may be applied to the control gate in excess of those applied to the N-well without creating a current path from the control gate to the N-well.

Programming may be accomplished by coupling a sufficient voltage to the floating gate via the control gate while biasing the source and drain regions so as to cause the tunneling of electrons from the channel to the floating gate. In some embodiments, erasing is accomplished by the tunneling of electrons from the floating gate to the channel and the source and drain regions. In yet other embodiments, an additional P-type diffusion region underlying the floating gate and separated therefrom by a layer of tunnel oxide serves as an erase gate for the memory cell. In such embodiments, erasing of the memory cell may be accomplished by causing electrons to tunnel from the floating gate to the erase gate.

BRIEF DESCRIPTION OF THE DRAWINGS

FIG. 6 is a cross-sectional view of the cell of FIG. 5 taken along line E—E;

FIG. 7 is a cross-sectional view of the cell of FIG. 5 taken along line F—F;

DETAILED DESCRIPTION

Figure 1:
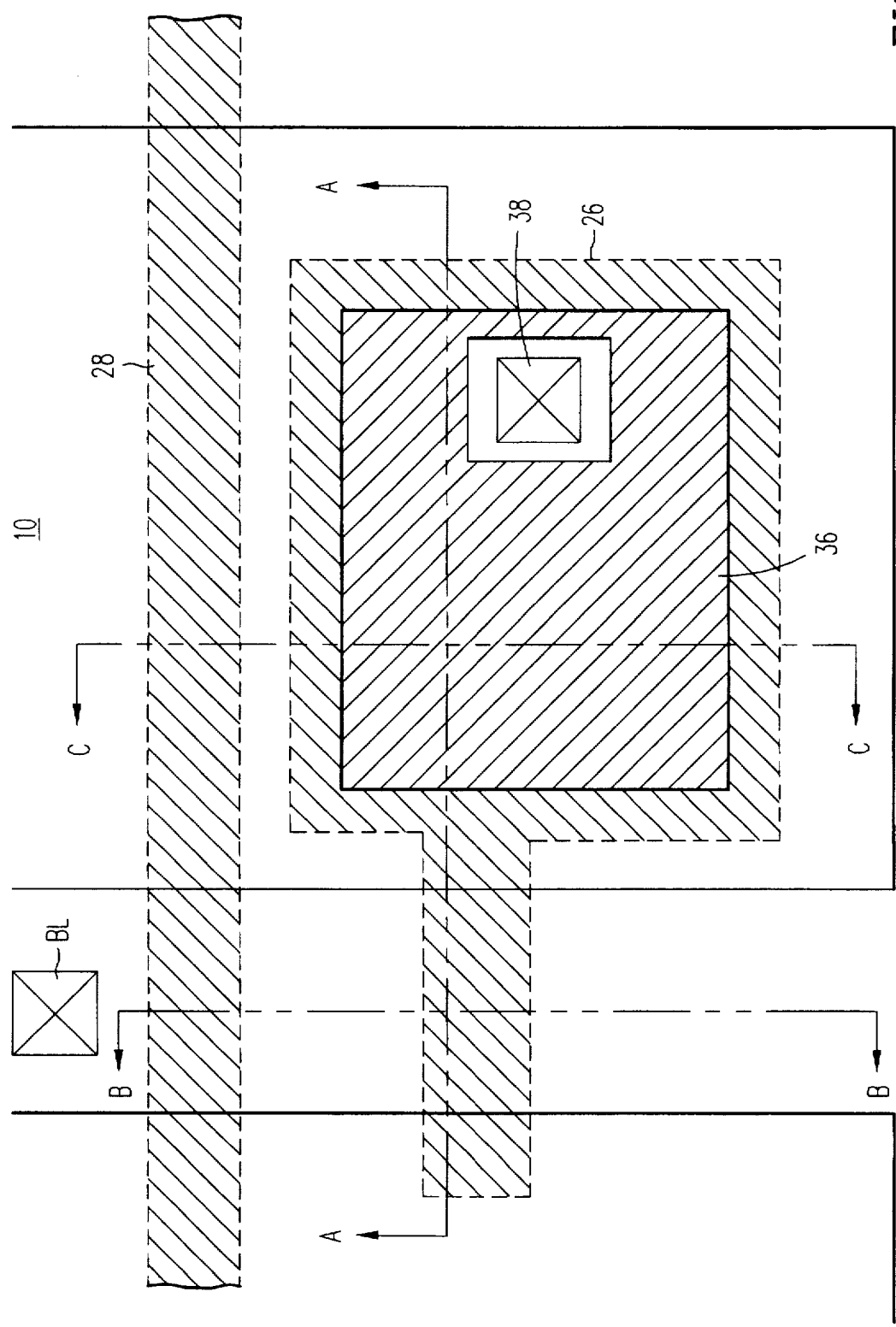
FIG. 1 is a top view of a PMOS single-poly flash cell in accordance with the present invention.
Figures 2, 3A:
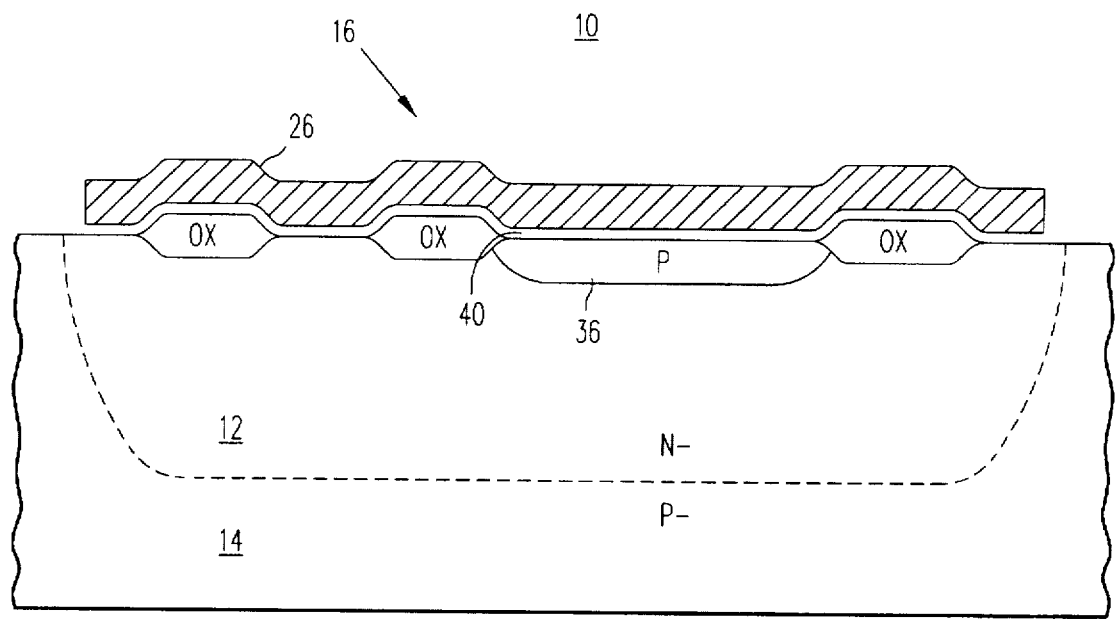
FIG. 2 is a cross-sectional view of the cell of FIG. 1 taken along line A—A.
FIGS. 3A and 3B are cross-sectional views of the cell of FIG. 1 taken along line B—B.

Referring now to FIGS. 1–4, a P-channel single-poly memory cell 10, as shown in FIG. 3A, is formed in an N-well 12 provided within a P-type substrate 14 and includes a P-channel storage transistor 16 and a P-channel select transistor 18. P+ diffusion region 20 serves as the source of storage transistor 16. P+ diffusion region 22 serves as both the drain of storage transistor 16 and the source of select transistor 18, and P+ diffusion region 24, which is coupled to a bit line BL, serves as the drain of select transistor 18. Poly-silicon gates 26 and 28 serve as the floating gate and select gate, respectively, of cell 10.

A P-type buried diffusion layer 36 serves as the control gate of cell 10 (FIGS. 1 and 2). A contact region 38 is opened in floating gate 26 and in a layer of oxide 40 interposed between floating gate 26 and control gate 36 to enable electrical contact with buried control gate 36. Tunnel oxide layer 34 (FIG. 3A), which is preferably 80–130 Å thick, may extend over channel 30 and substantial portions of source 20 and drain 22. A layer of oxide 40 (FIG. 2) approximately 80–350 Å thick is provided between floating gate 26 and P diffusion region 36. It is to be noted that unlike conventional N-channel single-poly EEPROM cells, it is not necessary to open a tunnel window in tunnel oxide layer 34. Application of a bias voltage to control gate 36 enhances a channel 30 (FIG. 3A) extending between source 20 and drain 22 of storage transistor 16, and the application of a bias voltage to select gate 28 enhances a channel 32 extending between source 22 and drain 24 of select transistor 18.

Together, floating gate 26 and control gate 36 form an MOS capacitor in a manner similar to that of conventional N-channel EEPROM cells. When floating gate 26 is uncharged, cell 10 has a threshold voltage $V_t$ of approximately −4.5V.

Figure 4:
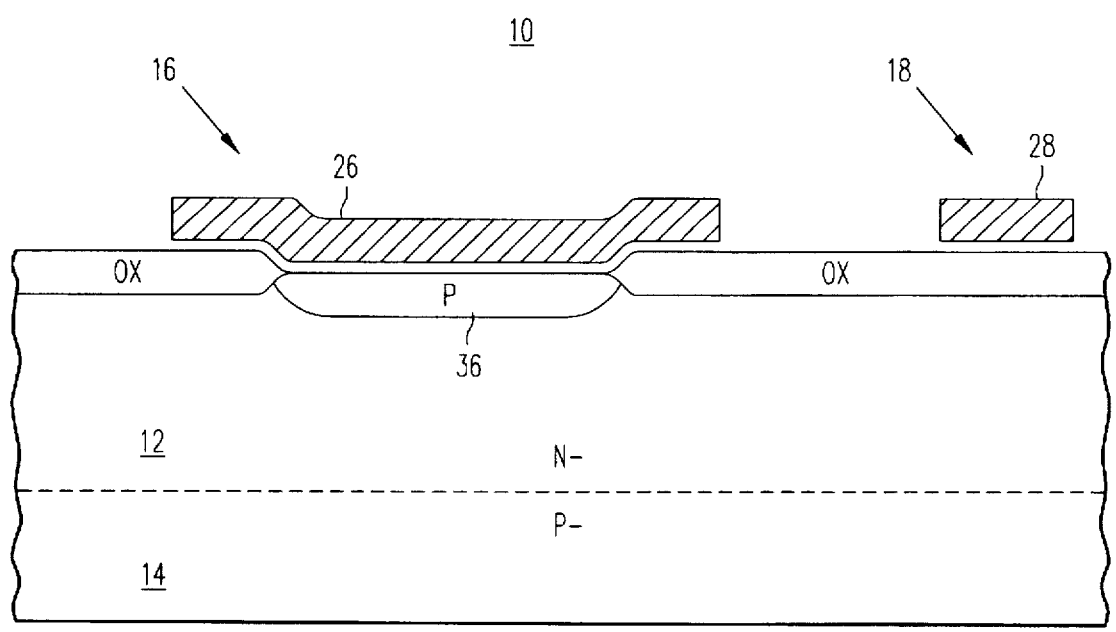
FIG. 4 is a cross-sectional view of the cell of FIG. 1 taken along line C—C.

The operation of cell 10 is as follows. To program cell 10, bit line BL and select gate 28 in FIG. 3A are grounded while source 20 and N-well 12 are held at approximately 8V. Approximately 8.5V is applied to control gate 36 (FIG. 4). Positively charged holes from P+ source 20 are attracted to the less positive voltage on P+ drain 22 and accelerate through channel region 30 towards P+ drain 22. These holes collide with electrons in a depletion layer proximate drain 22. High energy electrons generated from the resultant impact ionization are attracted by the positive voltage on floating gate 26 (approximately 7.5V is capacitively coupled thereto via control gate 36, source 20, channel region 30, and drain 22) and are thus injected from the drain depletion layer into floating gate 26. The resultant negative charge on floating gate 6 depletes channel region 30. In some embodiments, storage transistor 16 has in its programmed state a threshold voltage $V_t$ equal to approximately 1V. In preferred embodiments, a current limiting device (not shown) is coupled to bit line BL to prevent programming currents from exceeding approximately 100 μA, thereby limiting power consumption during programming.

Cell 10 is erased by applying approximately 18V to bit line BL, P+ source 20, and N-well 12 while grounding select gate 28 and control gate 36 in FIG. 3A. Electrons tunnel from floating gate 26 through the entire length of tunneling oxide layer 34 into channel 30, source 20, and drain 22, thereby returning the threshold voltage of storage transistor 16 to its normal erased state value of approximately −4V.

Note that electrons will tunnel from floating gate 26, and thereby erase cell 10, only if the voltage on drain 22 is or exceeds approximately 18V.

In another embodiment, cell 10 may be erased by applying approximately 8V to bit line BL, P+ source 20, and N-well 12 while grounding select gate 28 and applying approximately −10V to control gate 36 (FIG. 4). The application of these erase voltages, which results in an erasing of cell 10 in a manner identical to that described earlier, advantageously requires lower erase voltages.

Where it is desired to read cell 10, a read voltage of approximately ($V_{cc}$ - 2V) is applied to control gate 36 (FIG. 4) and $V_{cc}$ is applied to P+ source 20 and to N-well 12 (FIG. 3A). Select gate 28 is grounded. A voltage less than $V_{cc}$ is applied to P+ drain 24 via bit line BL. Cell 10 will conduct channel current only if cell 10 is programmed, i.e., only if there is negative charge stored in floating gate 26. Thus, since a read current flows through cell 10 when floating gate 26 is negatively charged, a programmed cell 10 does not suffer from read disturb problems characteristic of conventional N-channel EEPROM cells. Further, when cell 10 is in an erased state, the voltage on floating gate 26 is always less than the voltage on drain 22. In this manner, cell 10 does not exhibit read disturb problems when in an erased state.

Acceptable ranges for the above-described reading, erasing, and programming bias conditions for cell 10 are provided below in Table 1.

TABLE 1

| | Electrical bias conditions | | | | |
|---|---|---|---|---|---|
| Mode | Bit Line | Select Gate | Source | N-well | Control Gate |
| Program | 0V | 0V | 5–15V | 5–15V | 5–15V |
| Erase (option 1) | 3–15V | 0V | 3–15V | 3–15V | −3 to −15V |
| Erase (option 2) | 15–22V | 0V | 15–22V | 15–22V | 0V |
| Read | less than Vcc | 0V | Vcc | Vcc | 0 to Vcc |

Table 1

The above-described operation of cell 10 utilizes PMOS characteristics to achieve advantages over conventional N-channel single-poly semiconductor memory cells. The characteristic gate current for P-channel devices is approximately 50 times that of N-channel devices. Thus, unlike conventional NMOS EEPROM cells which typically require approximately a 0.5 milli-amp programming current to charge the floating gate, cell 10 requires a programming current of only a few micro-Amps. Requiring a programming current more than one order of magnitude smaller than that of conventional NMOS non-volatile memory cells (e.g., EPROMs, EEPROMs, and Flash) not only allows for a reduction in power consumption during programming but also allows for page writing, i.e., to simultaneously write to numerous ones of cells 10 in a row of an associated memory array (not shown).

It is known that the channel of conventional NMOS non-volatile memory cells must be of a sufficient length to tolerate the typically high reverse bias voltage across the P-well/N+ drain junction (as well as the resultant high electric field) required during programming and erasing via electron tunneling. As a result, it is difficult to further reduce the size of such conventional non-volatile cells without incurring destructive junction stress. Since, however, the operation of cell 10 neither requires nor utilizes a high voltage bias across its N-well/P+ drain junction during programming and erasing (see Table 1), the channel length of cell 10 is not so limited. Indeed, this feature allows cell 10 to be fabricated using 0.18 μm technology, thereby resulting in cell 10 being of a smaller size than conventional N-channel single-poly cells. For instance, while cell 10 is only about 25 μm² using 0.5 μm technology, conventional N-channel single-poly cells are typically on the order of 160 μm² using 0.5 μm technology. Further, eliminating such high junction biases during erasing advantageously results in a more durable and reliable memory cell.

It is also known that as the channel length of an NMOS transistor falls below approximately 0.7 μm, electron mobility saturates. In PMOS devices, however, hole mobility continues to increase as the channel length decreases below 0.7 μm and becomes comparable to electron mobility as the channel length is further decreased. Accordingly, minimizing the channel lengths of storage transistor 16 and select transistor 18 advantageously results in a hole mobility comparable to electron mobility, thereby increasing the speed with which cell 10 may be read. Further, note that programmed cell 10 in deep depletion allows for a higher read current and thus for faster read speeds.

As described above and shown in Table 1, PMOS single-poly cell 10 requires only approximately 8.5V for programming and erasing operations, as compared to the 20V or more required for programming and erasing conventional NMOS single-poly memory cells, and is thus more readily adaptable to the low voltage operation of a standard logic process.

Figure 3B:
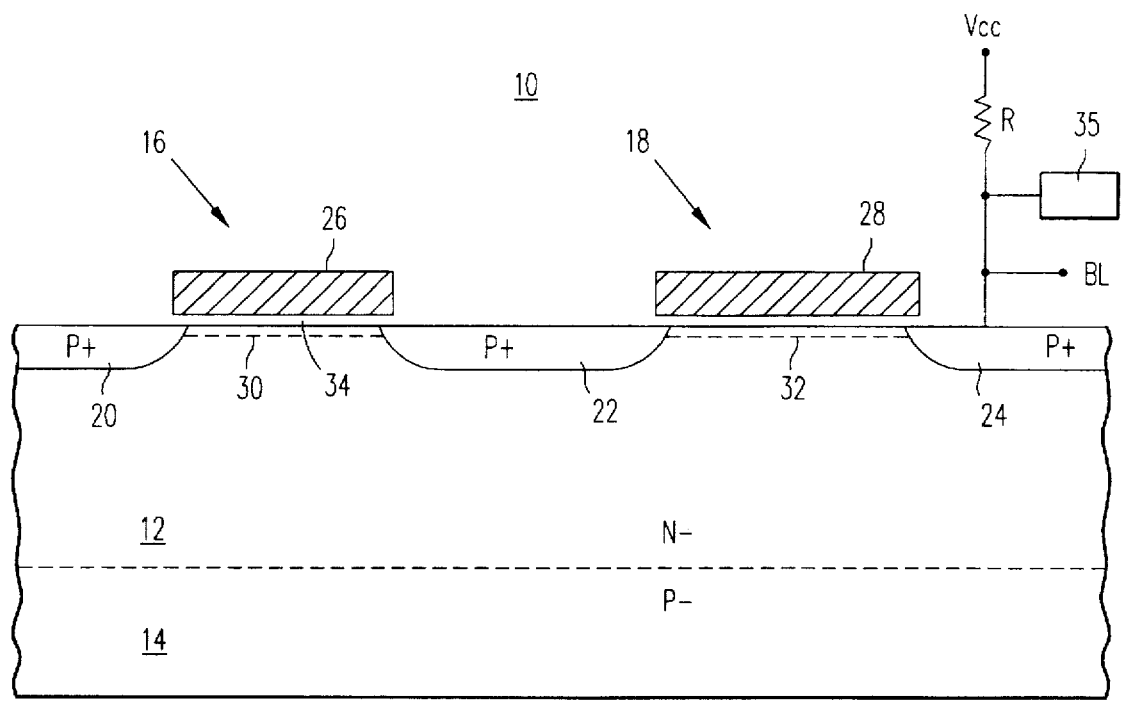

Cell 10 is also capable of storing numerous bits of binary data by programming storage transistor 16 to one of many different threshold voltage $V_t$ levels, where the $V_t$ levels depend on, and are thus determined by, the voltage applied to control gate 36. In such multi-level threshold voltage applications, where it is necessary to accurately measure the threshold voltage $V_t$ of storage transistor 16, drain 24 of select transistor 18 is coupled to $V_{cc}$ through a high impedance resistor R and to a voltage sensing circuit 35, as shown in FIG. 3B. Sensing circuit 35 allows for accurate determination of the threshold voltage $V_t$, and thus the multiple-level data stored in cell 10.

In such multi-level applications, cell 10 has in its natural state a $V_t$ of approximately −6V and has in its fully charged state a threshold voltage $V_t$ of approximately 9V. Using a range of voltage from 5V to 15V as the program voltage $V_p$ applied to control gate 36 during programming, the threshold voltage $V_t$ of storage transistor 16 may be set between approximately −1 V and 9V. Where $V_{cc}$ is approximately 5V, the range of bit line BL voltages produced in response to varying the threshold voltage $V_t$ is approximately 1 to 5V, thereby resulting in a 4V range. Since the threshold voltage $V_t$ of storage transistor 16 may be programmed in 4 mV increments, 1000 levels of programming are possible with cell 10. Acceptable ranges for bias conditions during programming, reading, and erasing cell 10 for multi-level applications are listed below in Table 2.

TABLE 2

| | Electrical bias conditions | | | | |
|---|---|---|---|---|---|
| Mode | Bit Line | Select Gate | Source | N-well | Control Gate |
| Program (option 1) | 0V | 0V | 5–15V | 5–15V | desired $V_p$, i.e., (5–15V) |
| Program (option 2) | 0V | 0V | 5–15V | 5–15V | ramp up to desired $V_p$ |
| Erase (option 1) | 3–15V | 0V | 3–15V | 3–15V | −3 to −15V |
| Erase (option 2) | 15–22V | 0V | 15–22V | 15–22V | 0V |
| Read (option 1) | less than Vcc | 0V | Vcc | Vcc | 0 to Vcc |
| Read (option 2) | pre-charge to Vcc | 0V | 0V | Vcc | 0V |

Figure 5:
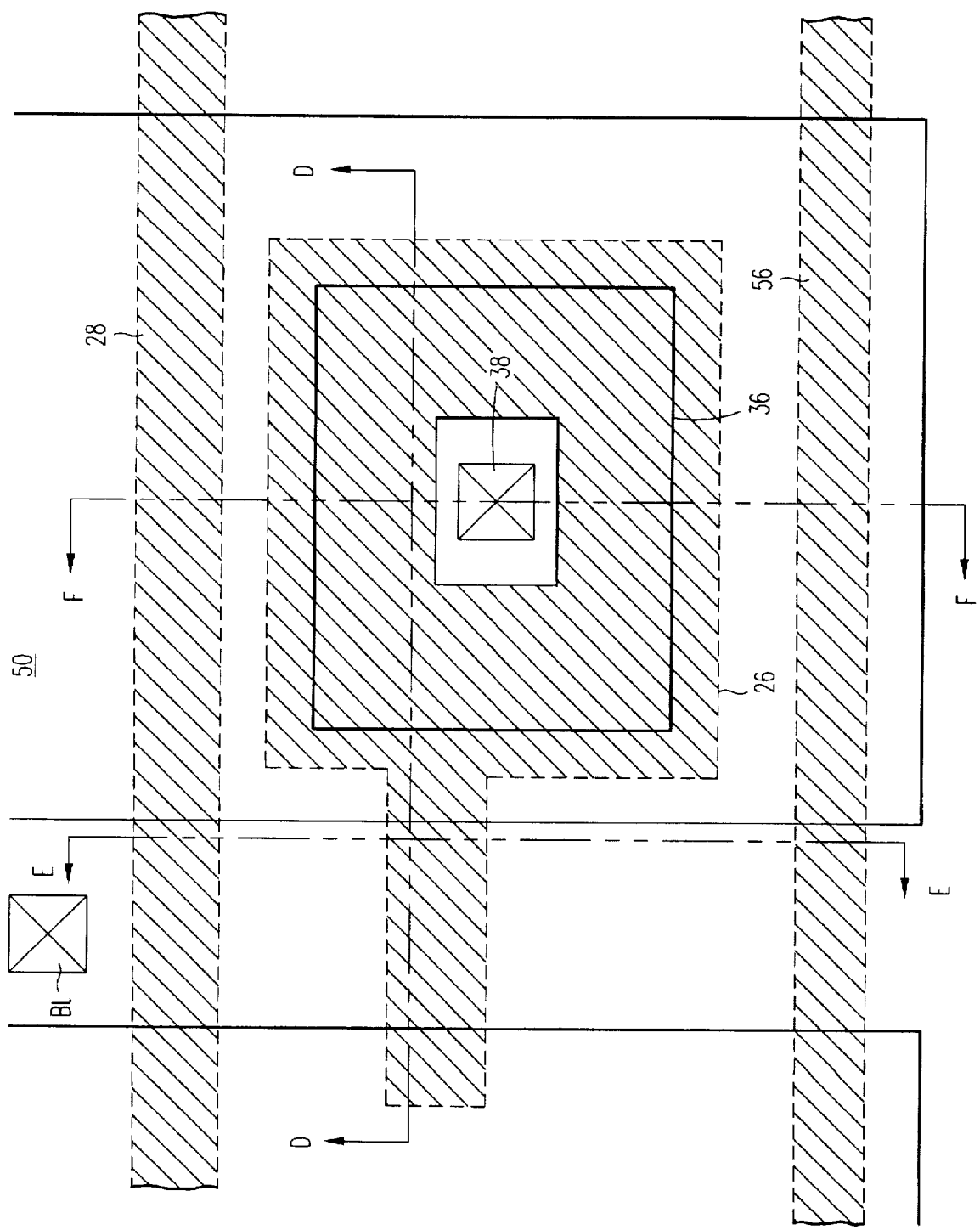
FIG. 5 is a top view of a PMOS single-poly EEPROM cell in accordance with the present invention.
Figure 8:
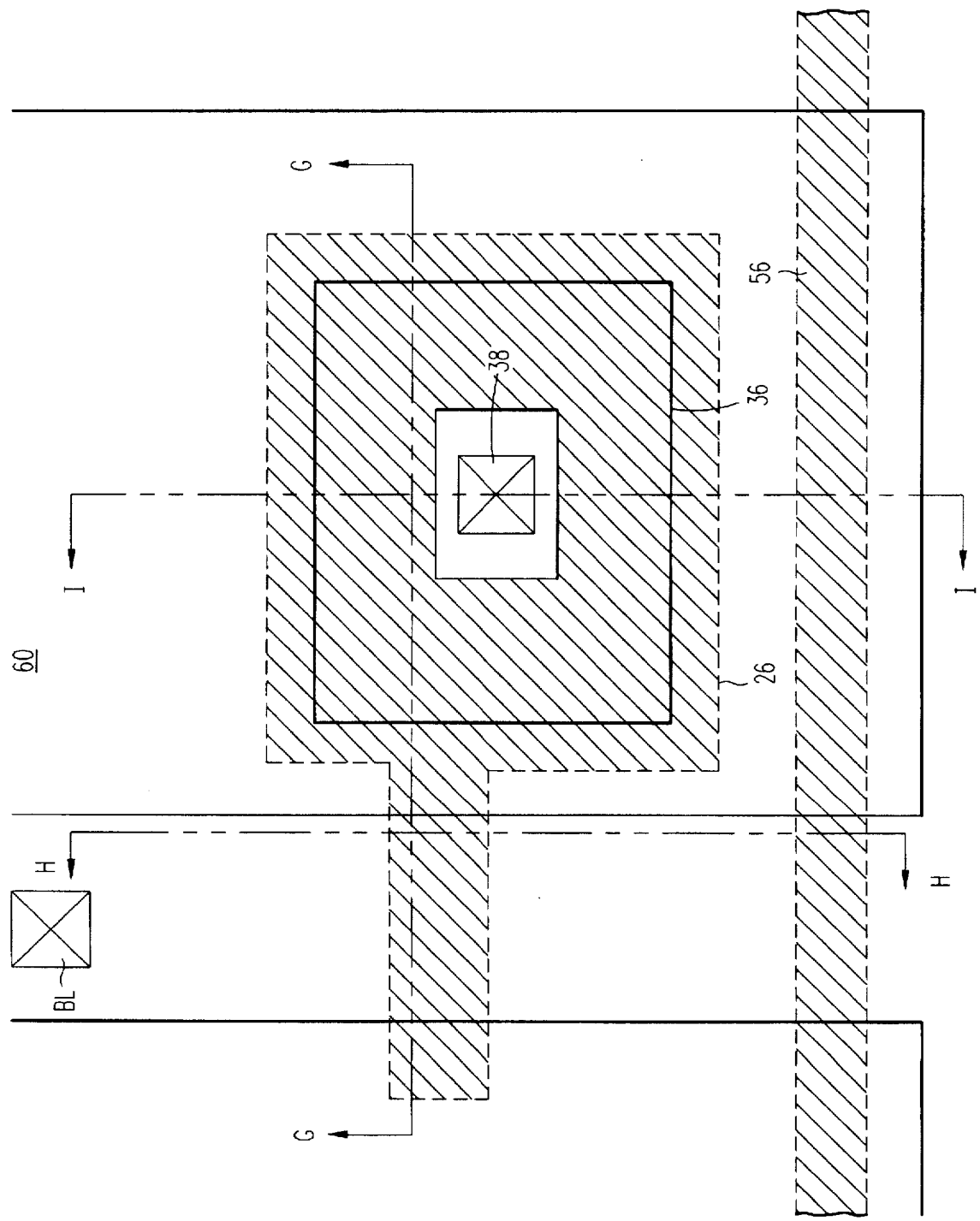
FIG. 8 is a top view of a PMOS single-poly memory cell in accordance with the another embodiment of the present invention.
Figure 9:
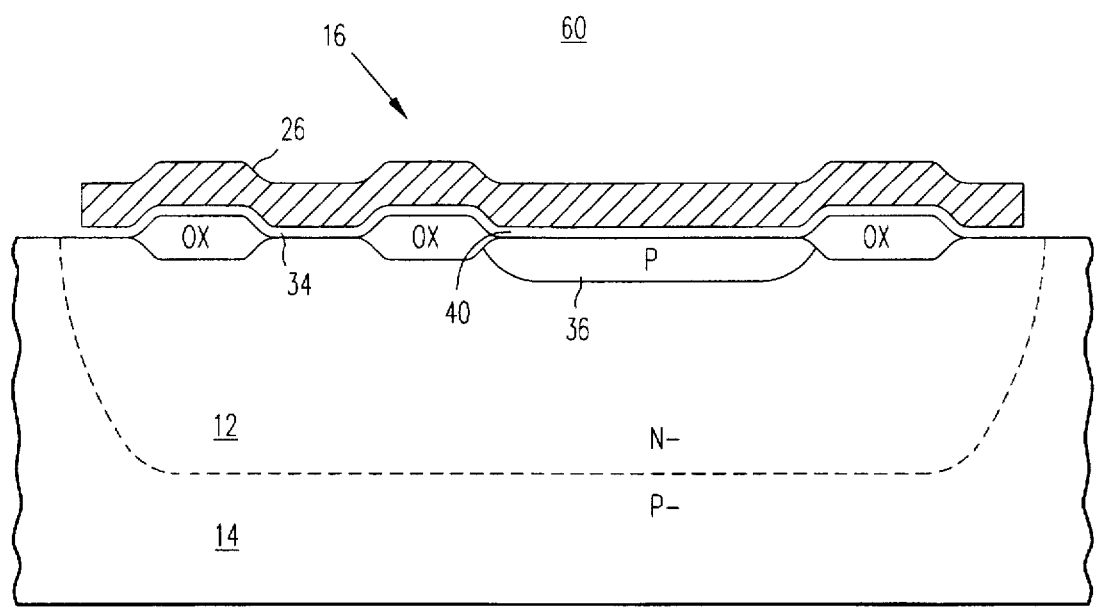
FIG. 9 is a cross-sectional view of the cell of FIG. 8 taken along line G—G.

In other embodiments, the structure of cell 10 may be incorporated into a larger PMOS single-poly EEPROM cell 50. Referring to FIGS. 5–7 (note that the cross-sectional view taken along line D—D is identical to that shown in FIG. 2 and is thus not again shown), cell 50 in FIG. 6 is shown formed in N-well 12 and includes a source select transistor 52 on the source side of cell 10. Those components common to cells 10 and 50 are appropriately labeled with the same numerals. P+ diffusion regions 54 and 20 serve as the source and drain, respectively, of select transistor 52. A polysilicon gate 56 controls an underlying channel region 58. The programming, erasing, and reading operations of cell 50 are nearly identical to that described above with respect to cell 10 and will thus not be discussed in detail here. Acceptable ranges for the bias conditions for programming, erasing, and reading are listed below in Table 3. The addition of source select transistor 52 to cell 10 results in an EEPROM cell 50 that is both bit-to-bit programmable and bit-to-bit erasable. In this manner, erasing flexibility is increased.

TABLE 3

| Mode | Bit line | Drain select gate | Source select gate | Source | N-well | Cell control gate |
|---|---|---|---|---|---|---|
| Program | 0V | 0V | * | 5V–15V | 5V–15V | 5–15V |
| Erase (option 1) | 3V–15V | 0V | 3V–15V | 3V–15V | 3V–15V | −3V to −15V |
| Erase (option 2) | 15V–22V | 0V | 15V–22V | 15V–22V | 15V–22V | 0V |
| Read | less than Vcc | 0V | 0V | Vcc | Vcc | 0V to Vcc |

*0 to (source voltage - 1V)

In a manner similar to that described above with respect to cell 10, cell 50 may be used in multi-level threshold voltage applications. In such applications, drain 24 of drain select transistor 18 is coupled to $V_{cc}$ through a high impedance resistor R (not shown) and to a voltage sensing circuit (not shown). The sensing circuit allows for accurate determination of the threshold voltage $V_t$, and thus the multiple-level data stored in cell 50. Acceptable ranges for bias conditions during programming, reading, and erasing cell 50 for multi-level applications are listed below in Table 4.

TABLE 4

| Mode | Bit line | Drain select gate | Source select gate | Source | N-well | Cell control gate |
|---|---|---|---|---|---|---|
| Program (option 1) | $V_p$ | 0V | 3V–15V | 3V–15V | 3V–15V | −3V to −15V |
| Program (option 2) | $V_p$ | 0V | 15V–22V | 15V–22V | 15V–22V | 0V |
| Erase | 0V | 0V | * | 5V–15V | 5V–15V | 5V–15V |
| Read (option 1) | less than Vcc | 0V | 0V | Vcc | Vcc | 0 to Vcc |
| Read (option 2) | pre-charge to Vcc | 0V | 0V | 0V | Vcc | 0V |

*0 to (source voltage − 1V)

Table 4

Figure 10:
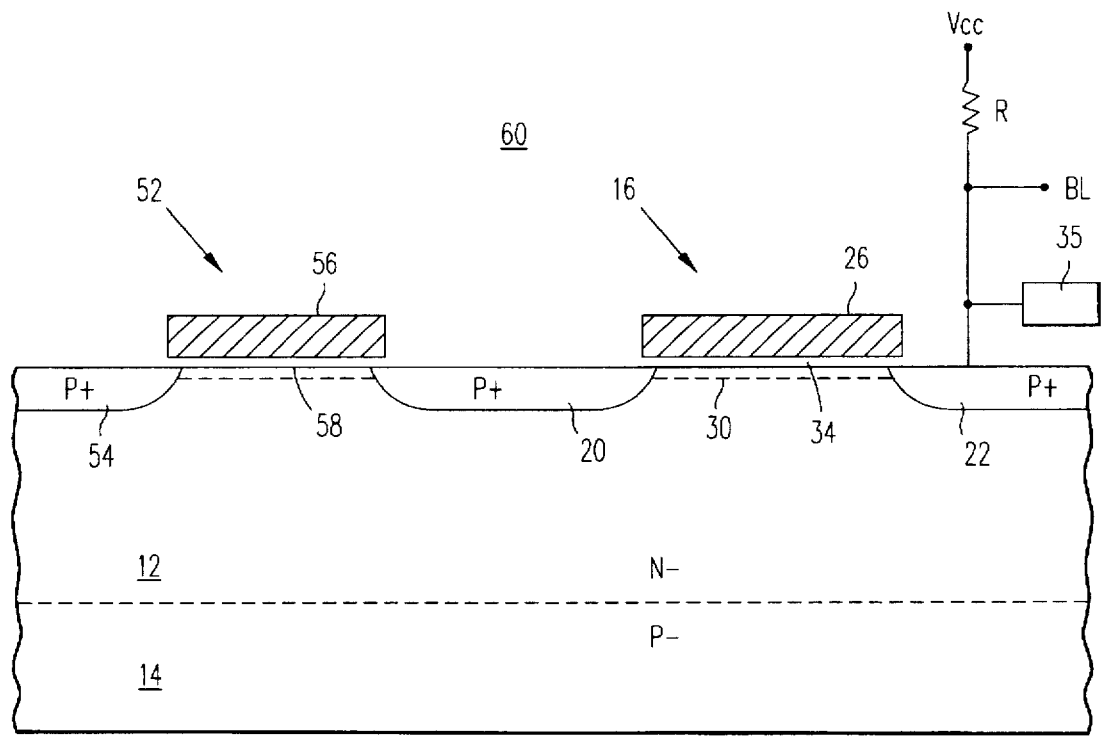
FIG. 10 is a cross-sectional view of the cell of FIG. 8 taken along line H—H.
Figure 11:
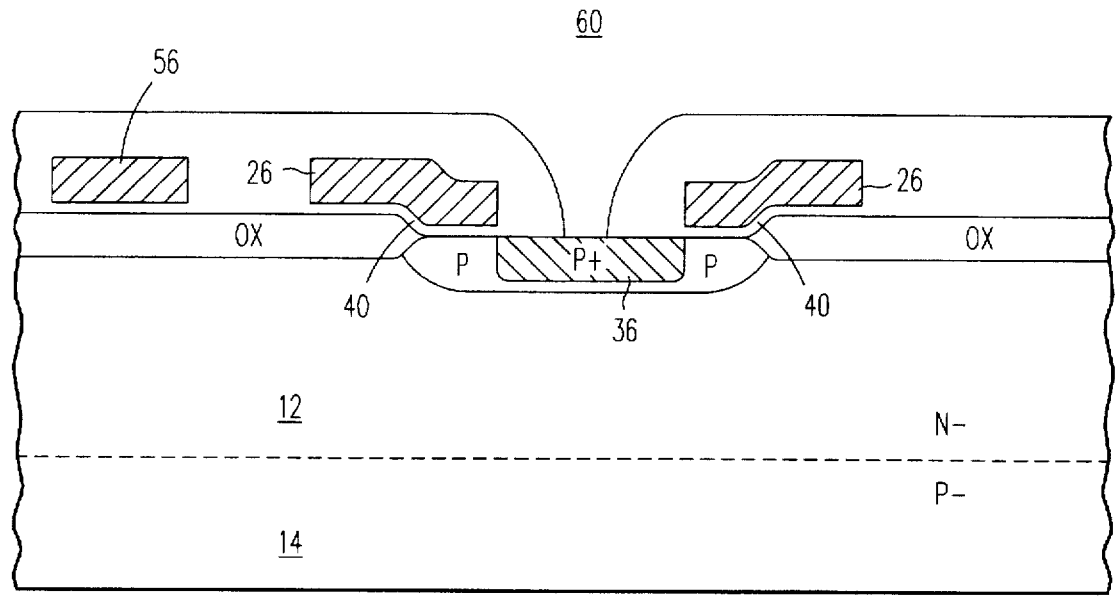
FIG. 11 is a cross-sectional view of the cell of FIG. 8 taken along line I—I.

In yet another embodiment in accordance with the present invention, as shown in FIGS. 8–11 cell 60 FIG. 10 includes storage transistor 16 which is coupled directly to bit line BL and source select transistor 52 which is coupled to source 20 of storage transistor 16, where those components common to cells 10, 50, and 60 are appropriately labeled with the same numerals. Note that drain 22 of storage transistor 16 may be coupled to $V_{cc}$ via high impedance resistor R and also to voltage sensing circuit 35 to enable accurate determination of the programmed threshold voltage $V_t$ of storage transistor 16. Cell 60 is of a smaller size than cell 50 and allows for column, i.e. sector, erasing. The operation of cell 60 is similar to that described above with respect to cell 50. Acceptable bias condition ranges for programming, erasing, and reading cell 60 are listed below in Table 5.

TABLE 5

| Mode | Bit line | Source select gate | Source | N-well | Cell control gate |
|---|---|---|---|---|---|
| Program (option 1) | 0V | 0V | 5V–15V | 5V–15V | 5V–15V |
| Program (option 2) | 0V | 0V | 5V–15V | 5V–15V | 0V ramped up to 5V–15V |
| Erase (option 1) | 3V–15V | 0V | 3V–15V | 3V–15V | −3V to −15V |
| Erase (option 2) | 15V–22V | 0V | 15V–22V | 15V–22V | 0V |
| Read | less than Vcc | 0V | Vcc | Vcc | 0V to Vcc |

*0 to (source voltage − 1V)

In a manner similar to that described above with respect to cell 10, cell 60 may be used in multi-level threshold voltage applications. Acceptable ranges for bias conditions during programming, reading, and erasing cell 60 for multi-level applications are listed below in Table 6.

TABLE 6

| Mode | Bit Line | Select Gate | Source | N-well | Control Gate |
|---|---|---|---|---|---|
| Program (option 1) | 0V | 0V | 5–15V | 5–15V | desired $V_p$, i.e, (5–15V) |
| Program (option 2) | 0V | 0V | 5–15V | 5–15V | ramp up to desired $V_p$ |
| Erase (option 1) | 3–15V | 0V | 3–15V | 3–15V | −3 to −15V |
| Erase (option 2) | 15–22V | 0V | 15–22V | 15–22V | 0V |
| Read (option 1) | less than Vcc | 0V | Vcc | Vcc | 0 to Vcc |
| Read (option 2) | pre-charge to Vcc | 0V | 0V | Vcc | 0V |

The above-described embodiments in which single-poly transistor 16 is used as the storage cell suffer from a common drawback. Referring to FIG. 2, the P/N junction formed by control gate 36 and N-well 12 must remain reverse biased in order to prevent a large and undesirable current flow from control gate 36 to N-well 12. Accordingly, the voltage applied to control gate 36 should never exceed the voltage of N-well 12 by more than approximately 0.6V. As a result, the voltage coupled to floating gate 26 via control gate 36 is limited by the amount of voltage applied to N-well 12, thereby unnecessarily restricting the performance of transistor 16.

Figure 12:
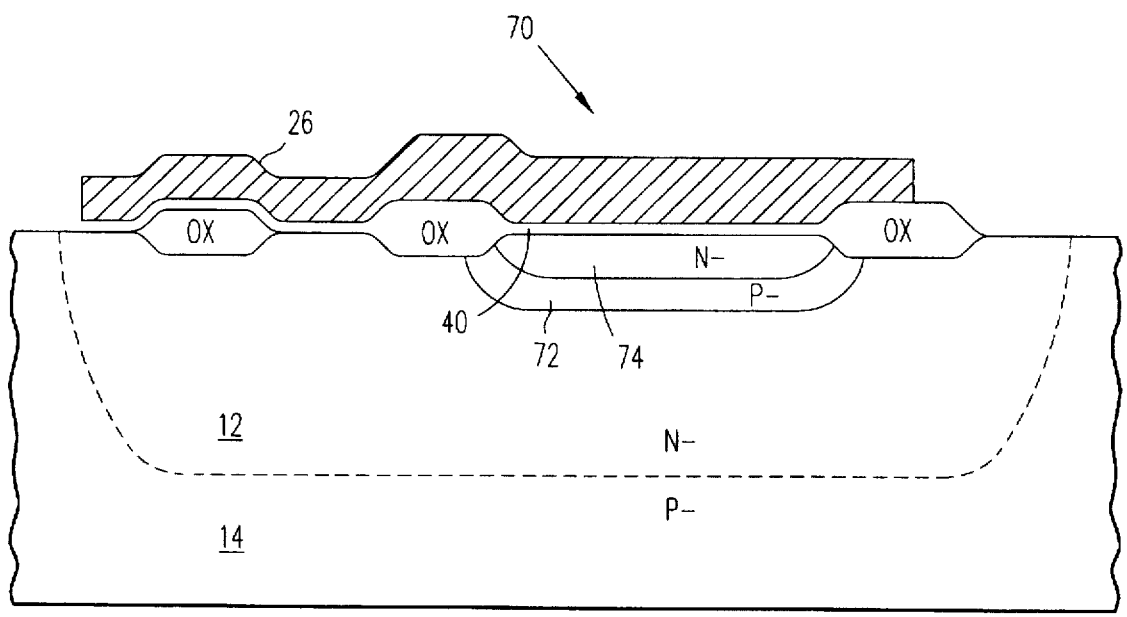
FIG. 12 is a cross-sectional view of a memory cell in accordance with yet another embodiment of the present invention.

In accordance with another embodiment of the present invention, a single-poly storage transistor 70 is provided, the performance of which is not so restricted. Referring now to FIG. 12, note that storage transistor 70 is identical to storage transistor 16 in every respect except for the structure of buried control gate 74, the operation and advantages of which will be described below. Accordingly, all components common to transistor 70 (FIG. 12) and transistor 16 (FIGS. 1–4) are appropriately labelled with same numerals.

Transistor 70 has a P-type diffusion region 72 within N-well 12. An N-type diffusion region 74 is formed within P-type diffusion region 72. N-type diffusion region 74 serves as the control gate for transistor 70, while P-type diffusion region 72 provides electrical isolation between control gate 74 and N-well 12. N-type control gate 74 may be electrically coupled to a contact in the same manner as is control gate 36 of cell 10 (described above with respect to FIGS. 1–4). Since control gate 74 is an N-type diffusion region and is formed within P-type diffusion region 72, the voltage on control gate 74 may exceed the voltage of N-well 12 without causing an undesirable current flow from control gate 74 to N-well 12. The elimination of such a restriction on the voltage of control gate 74 eliminates the need to maintain N-well 12 at high potentials during programming operations and, thus, allows transistor 70 to go even further into depletion when programmed. As a result, transistor 70 exhibits a higher read current than does transistor 16.

Storage transistor 70 may replace transistor 16 in any of the above-described memory cells 10, 50, and 60 to allow for faster access times. Tables 7, 8, and 9 list acceptable bias conditions for the programming, erasing, and reading of cells 10, 50, and 60, respectively, when employing transistor 70 as the storage element (as opposed to employing transistor 16).

TABLE 7

Electrical bias conditions

| Mode | Bit Line | Select Gate | Source | N-well | Control Gate |
|---|---|---|---|---|---|
| Program (option 1) | 0V | 0V | 5–15V | 5–15V | 5–17V |
| Program (option 2) | 0V | 0V | 5–15V | 5–15V | ramp up to between 5–17V from 0V |
| Erase (option 1) | 3–15V | 0V | 3–15V | 3–15V | –3 to –15V |
| Erase (option 2) | 15–22V | 0V | 15–22V | 15–22V | 0V |
| Read | less than Vcc | 0V | Vcc | Vcc | 0 to Vcc |

TABLE 8

| | Bit line | Drain select gate | Source select gate | Source | N-well | Cell control gate |
|---|---|---|---|---|---|---|
| Program | 0V | 0V | * | 5V–15V | 5V–15V | 5–17V |
| Erase (option 1) | 3V–15V | 0V | 3V–15V | 3V–15V | 3V–15V | –3V to –15V |
| Erase (option 2) | 15V–22V | 0V | 15V–22V | 15V–22V | 15V–22V | 0V |
| Read | less than Vcc | 0V | 0V | Vcc | Vcc | 0V to Vcc |

*0 to (source voltage - 1V)

TABLE 9

| | Bit Line | Source Select Gate | Source | N-well | Cell control gate |
|---|---|---|---|---|---|
| Program (option 1) | 0V | 0V | 5V–15V | 5V–15V | 5V–17V |
| Program (option 2) | 0V | 0V | 5V–15V | 5V–15V | ramp from 0V up to between 5V–17V |
| Erase (option 1) | 3V–15V | 0V | 3V–15V | 3V–15V | –3 to –15V |
| Erase (option 2) | 15V–22V | 0V | 15V–22V | 15V–22V | 0V |
| Read | less than Vcc | 0V | Vcc | Vcc | 0V to Vcc |

*0 to (source voltage - 1V)

Further, those embodiments of cells 10, 50, and 60 which employ as storage elements transistor 70 are also capable of multi-level threshold voltage applications, the operation of which is identical to that described above. Acceptable bias condition ranges for the programming, erasing, and reading of cells 10, 50, and 60 which employ transistor 70 are provided below in Tables 10, 11, and 12, respectively.

TABLE 10

Electrical bias conditions

| Mode | Bit Line | Select Gate | Source | N-well | Control Gate |
|---|---|---|---|---|---|
| Program (option 1) | 0V | 0V | 5–15V | 5–15V | ramp up to desired $V_p$ |
| Program (option 2) | 0V | 0V | 5–15V | 5–15V | desired $V_p$ |
| Erase (option 1) | 3–15V | 0V | 3–15V | 3–15V | –3 to –15V |
| Erase (option 2) | 15–22V | 0V | 15–22V | 15–22V | 0V |
| Read (option 1) | less than Vcc | 0V | Vcc | Vcc | 0 to Vcc |
| Read (option 2) | pre-charge to Vcc | 0V | 0V | Vcc | 0V |

TABLE 11

| | Bit line | Drain select gate | Source select gate | Source | N-well | Cell control gate |
|---|---|---|---|---|---|---|
| Program (option 1) | $V_p$ | 0V | 3–15V | 3–15V | 3–15V | –3 to –15V |
| Program (option 2) | $V_p$ | 0V | 15–22V | 15–22V | 15–22V | 0V |
| Erase | 0V | 0V | * | 5–15V | 5–15V | 5–17V |
| Read (option 1) | less than Vcc | 0V | 0V | Vcc | Vcc | 0 to Vcc |
| Read (option 2) | pre-charge to Vcc | 0V | 0V | 0V | Vcc | 0V |

*0 to (source voltage - 1V)

TABLE 12

Electrical bias conditions

| Mode | Bit Line | Select Gate | Source | N-well | Control Gate |
|---|---|---|---|---|---|
| Program (option 1) | 0V | 0V | 5V–15V | 5V–15V | desired $V_p$, i.e. (5–17V) |
| Program (option 2) | 0V | 0V | 5V–15V | 5V–15V | ramp up to desired $V_p$ |
| Erase (option 1) | 3V–15V | 0V | 3V–15V | 3V–15V | –3V to –15V |
| Erase (option 2) | 15V–22V | 0V | 15V–22V | 15V–22V | 0V |
| Read (option 1) | less than Vcc | 0V | Vcc | Vcc | 0 to Vcc |
| Read (option 2) | pre-charge to Vcc | 0V | 0V | Vcc | 0V |

The advantageous operational characteristics of the above described embodiments allow for such embodiments to be fabricated by a process simpler than those conventional processes used to fabricate N-channel single-poly non-volatile memory cells. The fabrication of cell 10 will be described below in the context of a larger CMOS structure 100 which includes PMOS and NMOS peripheral transistors (these peripheral transistors may be used for instance as address decoders, current sensors, select transistors, and on). Although described below in the context of fabricating cell 10 in a twin well structure, it is to be noted the process described below may be easily modified so that cell 10 may be formed in an N-well structure. Further, the process described below may also be used to fabricate cells 50, 60, or 70 using either single or twin well technology, and is equally applicable to those embodiments which employ as storage elements transistor 70.

Figure 13:
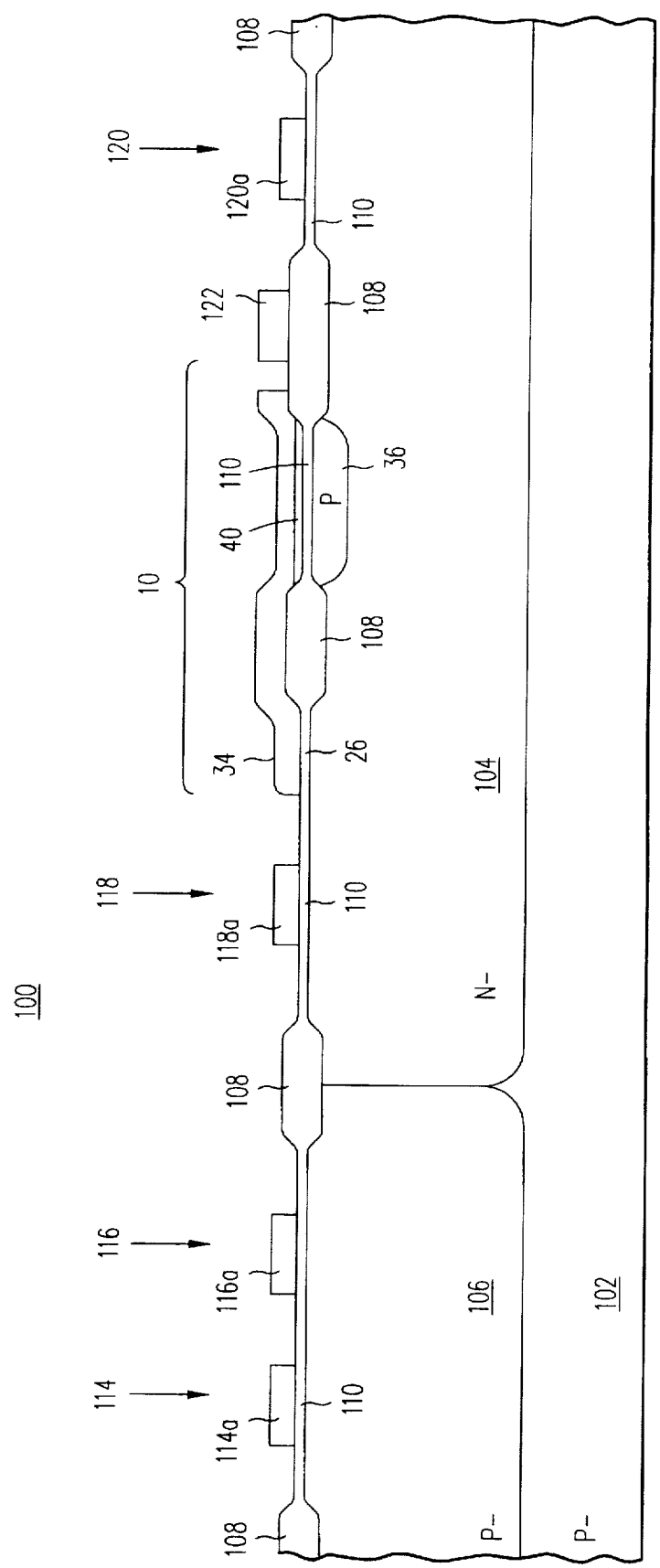
FIGS. 13 and 14 illustrate the fabrication of a P-channel single-poly memory cell in accordance with the present invention.

Referring now to FIG. 13, structure 100 includes a P-type substrate 102 having formed by conventional means therein an N-well 104 and a P-well 106. The resistivity and thickness of N-well 104 and P-well 106 will depend upon the desired characteristics of the devices to be formed therein. A LOCOS process is used to form isolation regions which will electrically insulate later-formed transistors from one another. Field oxide regions 108 approximately 7500 Å thick and a layer of sacrificial oxide (not shown) approximately 240 Å thick are formed on a top surface of substrate 102 by any suitable means.

Structure 100 is masked by any suitable means (not shown) such as for instance photoresist. P-type dopants such as $BF_2$ are implanted at an energy of 50 keV and a dosage of 1E14 ions/cm$^2$ into N-well 104 to form a P diffusion region 36 which will serve as the control gate for cell 10 (see also FIG. 2). The mask is then removed.

A layer of poly-silicon is deposited over a top surface of field oxide regions 108 and gate oxide 110 and selectively etched to form the pattern shown in FIG. 13. Portions 114a and 116a will serve as gates for NMOS peripheral transistors 114 and 116, respectively, while portions 118a and 120a will serve as gates for PMOS peripheral transistors 118 and 120, respectively. Portion 122 may serve as an interconnection between device formed within structure 100. Portion 26 will serve as the floating gate of cell 10.

The process steps used for threshold voltage implants and channel stop implants for cell 10 and peripheral transistors 114, 116, 118, and 120, as well as for the formation of tunnel oxide 34 and oxide layer 40 separating floating gate 26 from control gate 36 of cell 10, are not shown in the Figures or discussed herein for simplicity. In the preferred embodiment, Arsenic is implanted at an energy of 100 keV and a dosage of approximately of 2E13 ions/cm$^2$ or Phosphorus at an energy of 50 keV and a dosage of 2E13 ions/cm$^2$ as the threshold voltage implant for cell 10. Further, gate oxide layer 110 may also be implemented according to well known techniques and are thus described herein. Note, however, that as discussed above with respect to FIG. 3A, it is not necessary to open a tunnel window in tunnel oxide layer 34, thereby saving at least one masking step over conventional processes used to form N-channel single-poly EEPROM cells. Note that these just described process steps should be performed before the formation of gates 114, 116, 118, and 120, floating gate 26 and contact 122.

Figure 14:
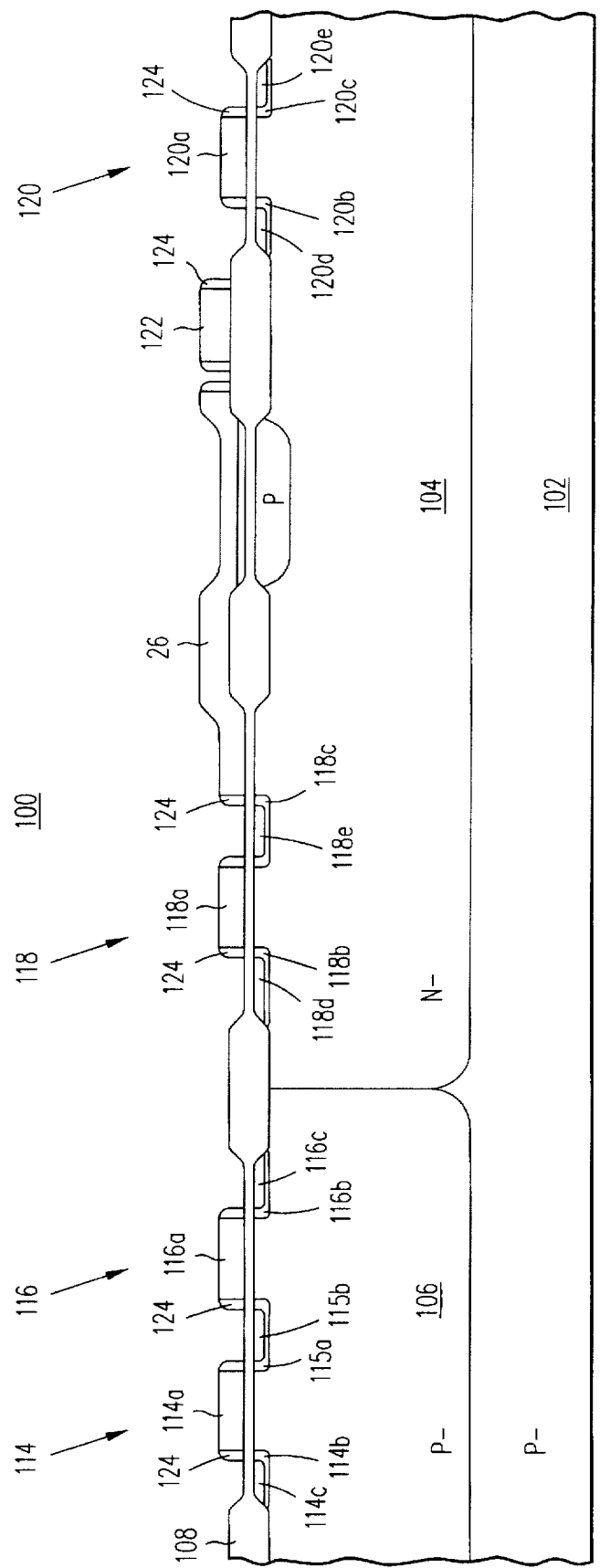

Referring now to FIG. 14, PMOS cell 10 and PMOS transistors 118, and 120 are masked (not shown). N-type dopants such as Phosphorus are implanted at an energy of approximately 40 keV and a dosage of approximately 3E13 ions/cm$^2$ into P-well 106 to form N-type regions 114b, 115a, and 116b. The mask is then removed.

NMOS transistors 114 and 116 are then masked (not shown) and P-type dopants such as $BF_2$ are implanted at an energy of approximately 60 keV and a dosage of approximately 7E12 ions/cm$^2$ into N-well 104 to form N-regions 118b, 118c, 120b, and 120c. Sidewall oxide spacers 124 are then formed by conventional means on the sides of control gates 114, 116, 118, and 120, layer 122, and floating gate 26.

PMOS cell 10 and PMOS peripheral transistors 118 and 120 are again masked and N-type dopants, preferably Arsenic, are implanted at an energy of 80 keV and a dosage of 6E15 ions/cm$^2$ into P-well 106 to form N+ diffusion regions 114c, 115b, and 116c, as shown in FIG. 14. N−/N+ diffusion region 114b/114c serves as the source for NMOS transistor 114, N−/N+ diffusion region 115a/115b serves as the drain for NMOS transistor 114 and the source for NMOS transistor 116, and N−/N+ diffusion region 116b/116c serves as the drain for NMOS transistor 116. The PMOS mask is then removed.

Structure 100 is again masked and the sidewall spacers 124 on the source and drain sides of floating gate 26 are dipped and removed. This ensures that in a subsequent doping step the source and drain regions (see FIG. 3A) of cell 10 will be of a P+ diffusion structure, as opposed to the lightly doped drain (LDD) structure of P−/P+ diffusion region 118c/118e. After this mask is removed, NMOS peripheral transistors 114 and 116 are masked and P-type implants, preferably $BF_2$, are implanted at an energy of 50 keV and a dosage of 2E15 ions/cm$^2$ into N-well 104 to form P+ regions 118d, 118e, 120d, and 120e, as well as P+ source 20 and P+ drain 22 regions (see FIG. 3) of cell 10. The P−/P+ diffusion regions 118b/118d and 118c/118e serve as the source and drain regions, respectively, of PMOS transistor 118, while P−/P+ diffusion regions 120b/120d and 120c/120e serve as the source and drain regions, respectively, of PMOS transistor 120.

The remaining portions of structure 100 may be completed according to well known fabrication techniques.

The process described above with respect to FIGS. 13 and 14 requires fewer masking steps than do conventional processes used in the fabrication of N-channel single poly memory cells. Since the source and drain regions of cell 10 may be formed simultaneously with the source and drain regions of PMOS peripheral transistors 118 and 120, an additional masking step is saved. Further, since as described earlier the operation of cell 10 does not require high voltages across its drain/N-well junction, neither N-channel or P-channel high voltage implants are necessary, thereby resulting in a further elimination of masking steps. In this manner, the fabrication of cell 10 may be realized while reducing manufacturing costs.

It is to be noted that the above described fabrication process may be easily adapted to construct memory cells employing as memory elements single-poly transistors 70 in accordance with embodiments of the present invention. Further, the polarities of the bipolar and MOS transistors may be reversed while still realizing the benefits of the above described invention.

In accordance with yet another embodiment of the present invention, the structure of cell 10 is modified and an additional diffusion region added thereto so as to allow for lower erase voltages. Those components common to cell 200 and cell 10 are appropriately labeled with the same numerals.

Figure 17:
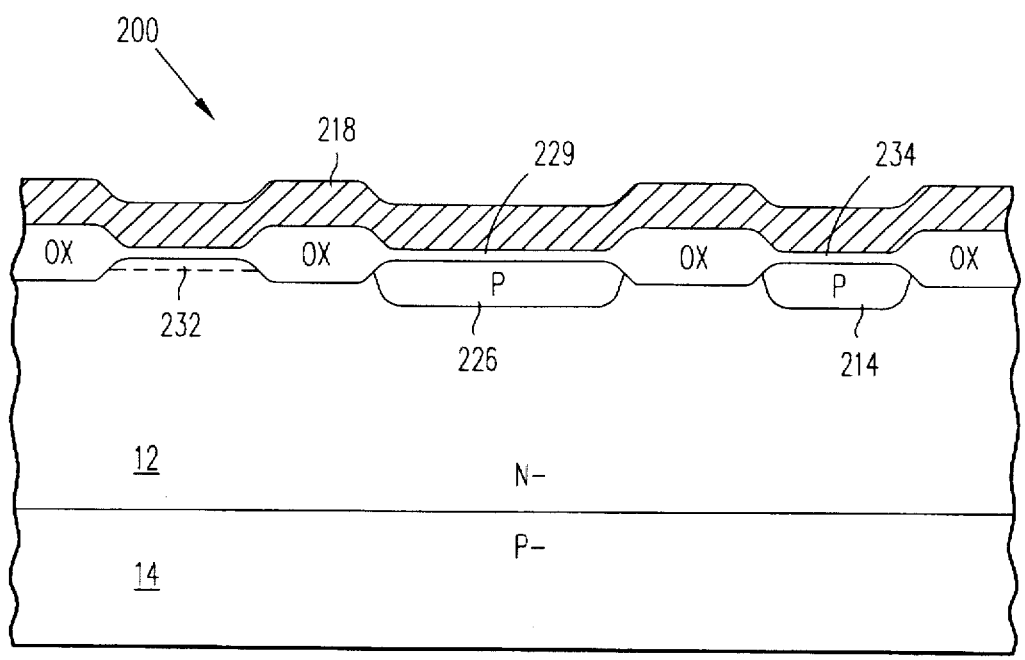
FIG. 17 is a cross-sectional view of the device of FIG. 15 taken along line BB—BB.
Figure 18:
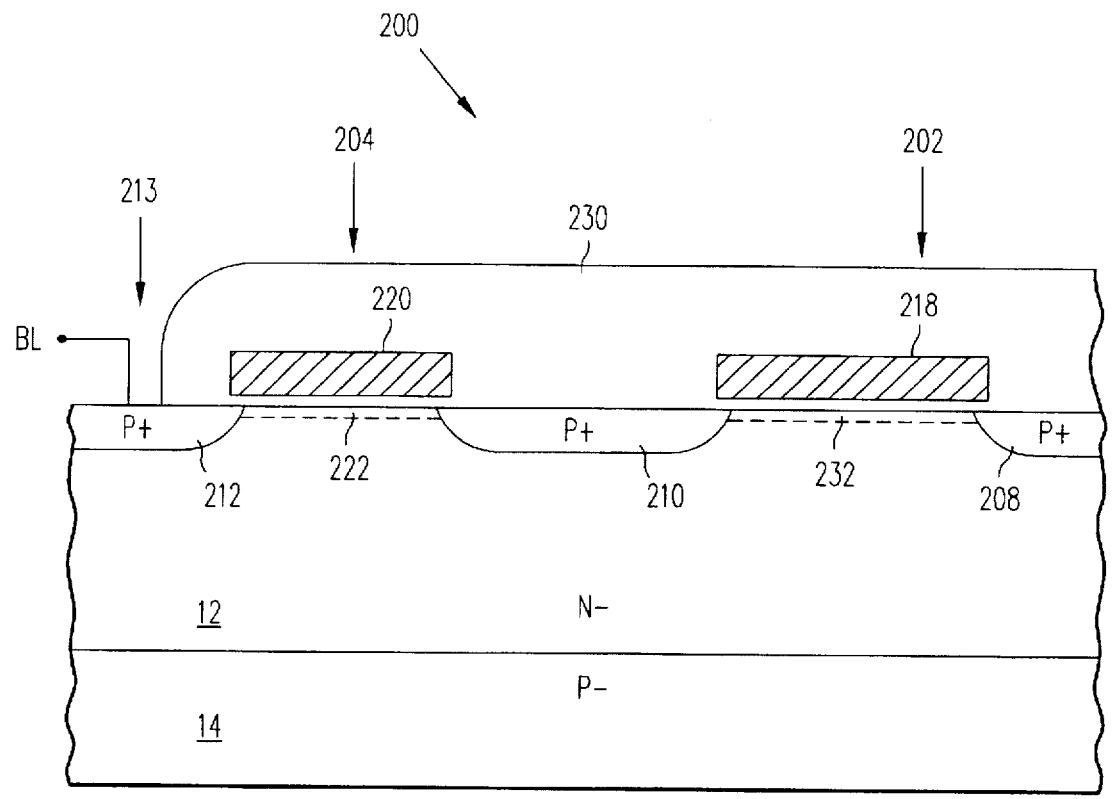
FIG. 18 is a cross-sectional view of the device of FIG. 15 taken along line CC—CC.

Referring collectively to FIGS. 15–20, cell 200 includes a storage transistor 202, a select transistor 204, and an erase transistor 206 separated by field oxide regions OX. In FIG. 18, P+ diffusion region 208 serves as the source for storage transistor 202, P+ diffusion region 210 serves as both the drain for storage transistor 202 and the source for select transistor 204, and P+ diffusion region 212 serves as the drain of select transistor 204. A bit line BL is coupled to drain 212 of select transistor 204 via a contact 213. P+ diffusion regions 214 and 216 serve as the source and drain, respectively, of erase transistor 206 (see FIG. 20). A contact 217 couples drain 216 of erase transistor 206 to an erase line EL. A polysilicon layer 218 serves as the floating gate of storage transistor 202, and a polysilicon layer 220 serves as the gate for both select transistor 204 and erase transistor 206. Application of a bias voltage to gate 220 enhances a channel 222 (FIG. 18) extending between source 210 and drain 212 of select transistor 204 and enhances a channel 224 (FIG. 20) extending between source 214 and drain 216 of erase transistor 206.

Figure 15:
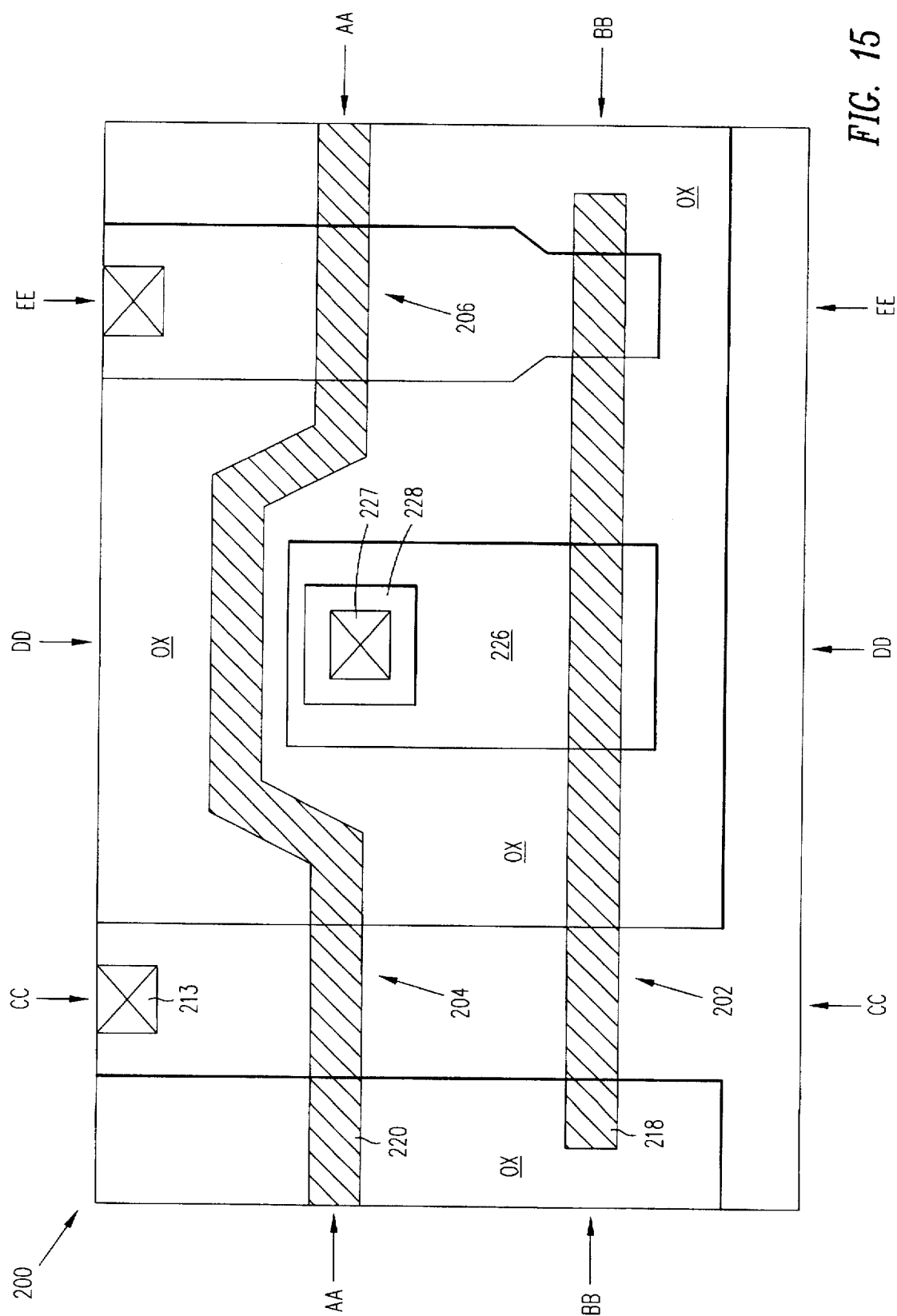
FIG. 15 is a top view of a PMOS single-poly memory device having an erase gate in accordance with the present invention.
Figure 16:
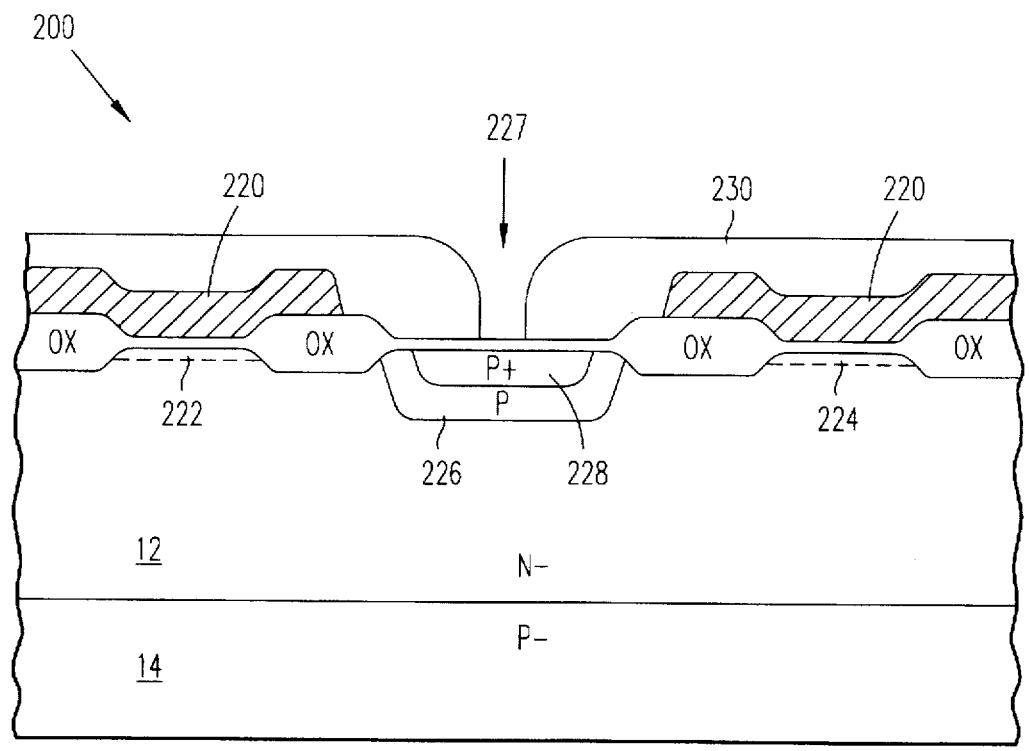
FIG. 16 is a cross-sectional view of the device of FIG. 15 taken along line AA—AA.

A P-type buried diffusion layer 226 serves as the control gate of storage transistor 202 and has formed therein a P+ contact region 228 (see FIGS. 15 and 17). A layer of oxide 229 (FIG. 17) approximately between 80–350 Å thick is provided between control gate 226 and floating gate 218. An opening in insulating layer 230 and oxide 229 enables electrical contact with buried control gate 226 via a P+ contact region 228 (FIG. 15). A tunnel oxide layer 234 (FIG. 20) preferably between 80–130 Å thick is provided between floating gate 218 and a P-type diffusion region 215, which serves as an erase gate, to facilitate the tunneling of electrons from floating gate 218 to P-type diffusion region 215. In some embodiments, tunnel oxide layer 234 extends between floating gate 218 and a portion of P+ diffusion region 214 to also facilitate electron tunneling from floating gate 218 to a portion of P+ diffusion region 214. Floating gate 218 and control gate 226 form an MOS capacitor in the same manner as that of conventional N-channel EEPROM cells. Note, however, that unlike conventional N-channel single-poly memory cells, it is not necessary to open a tunnel window in tunnel oxide layer 234 of cell 200.

Figure 19:
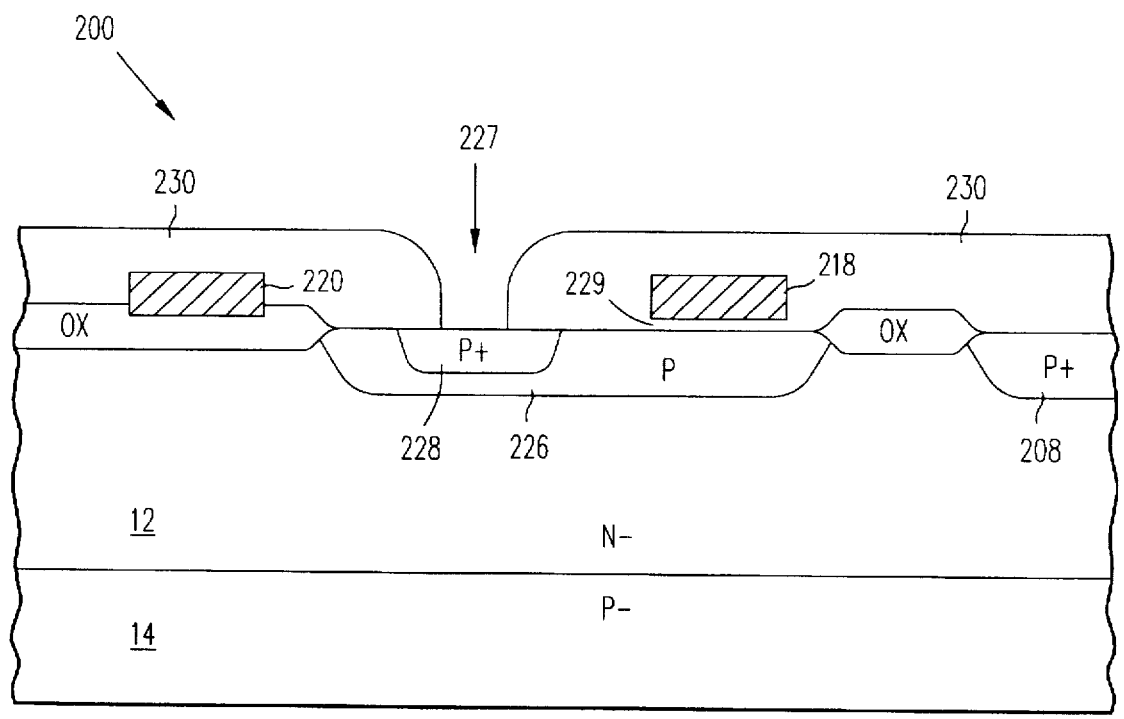
FIG. 19 is a cross-sectional view of the device of FIG. 15 taken along line DD—DD.
Figure 20:
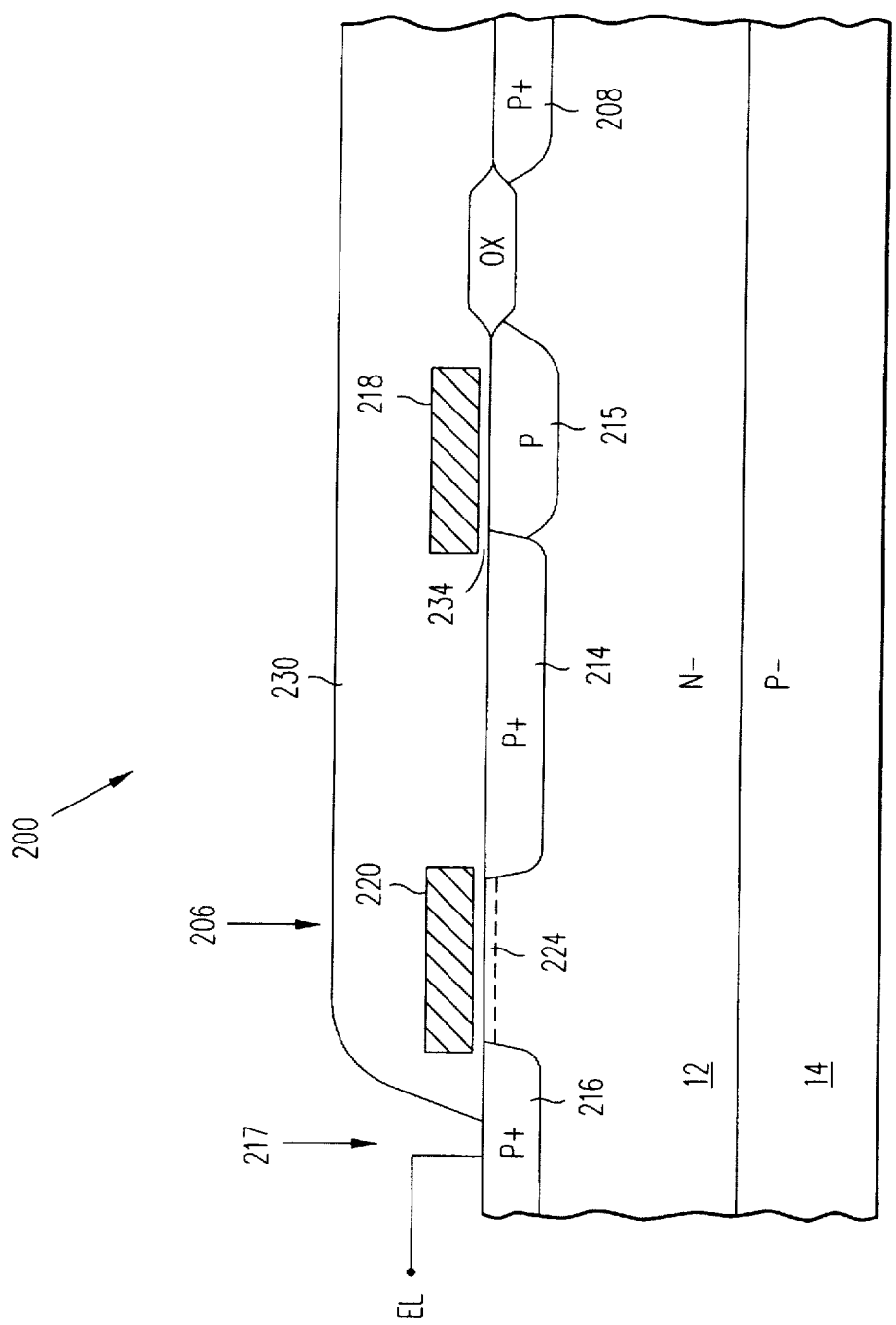
FIG. 20 is a cross-sectional view of the device of FIG. 15 taken along line EE—EE.

Cell 200 has in its unprogrammed state a threshold voltage $V_t$ equal to approximately −4.5V. To program cell 200, in FIG. 18, bit line BL and select gate 220 are grounded while source 208 of storage transistor 202, N-well 12, and erase line EL (which is shown in FIG. 20 coupled to drain 216 of erase transistor 206) are held at approximately 7V. A program voltage which ramps from 0 to approximately 12 V is coupled to control gate 226 via P+ contact region 228 (FIG. 19). A fraction of the resultant voltage on control gate 226 is capacitively coupled to floating gate 218. In the preferred embodiment, ramping the voltage of control gate 226 from 0 to 12V results in approximately 7.5V being coupled to floating gate 218. Note that the precise amount of voltage so coupled to floating gate 218 depends upon the coupling ratio between control gate 226 and floating gate 218.

The application of the above-described voltages causes positively charged holes to accelerate across channel 232 from source 208 to drain 210 (FIG. 18). These holes collide with electrons in a depletion region proximate drain 210 and thereby generate high energy electron which, being attracted to the positively charged floating gate 218, are injected from the depletion region into floating gate 218. The resultant negative charge on floating gate 218 depletes channel region 232 and forces cell 200 into deep depletion. When programmed as such, cell 200 has a $V_t$ equal to approximately 1V. In some embodiments, a current limiting device (not shown) is coupled to bit line BL to prevent programming currents from exceeding approximately 100 μA, thereby limiting power consumption during programming.

Cell 200 is erased by grounding select gate 220, bit line BL, and source 208 of storage transistor 202, while applying approximately 8V to erase line EL (FIG. 20) and applying approximately 8V to control gate 226 (FIG. 19). N-well 12 is maintained either at approximately ground potential or a floating potential during erasing. This electrical bias condition causes electrons to tunnel from floating gate 218 (FIG. 19) through tunnel oxide layer 234 into erase gate 215 and a portion of P+ diffusion region 214, thereby returning the threshold voltage of storage transistor 202 to its normal erased state value of approximately −4V. Note that during erasing operations electrons do not tunnel from floating gate 218 into channel 232, source 208, or drain 210 of storage transistor 202.

Erasing floating gate 218 in the manner described above allows for lower erase voltages and also allows for cell 200 to handle higher read currents, and thereby operate at higher speeds, without undesirably increasing the size dimensions of cell 200, as will be described below. It is known that the amount of read current realizable by a memory cell may be increased by increasing the width of the channel region. In a single-poly memory cell the ratio between the voltage applied to the buried control gate and the voltage coupled to the floating gate (the coupling ratio) is equal to $C_2/(C_1+C_2)$, where $C_1$ is the capacitance of the channel region and $C_2$ is the capacitance of the buried control gate. Thus, increasing the width of the channel region, and thus the capacitance of the channel region, undesirably reduces the coupling ratio which, in turn, requires higher voltages to be applied to the control gate in order for a sufficient program voltage to be coupled to the floating gate. Although a decrease in the coupling ratio may be offset by increasing the surface area and thus the capacitance of the control gate, even minimal increases in the above described coupling ratio would require significant increases in the surface area of the control gate, thereby undesirably increasing the size of the memory cell.

The above-described erasing operation of cell 200 eases this trade-off. The grounding of channel region 232 results in channel region 232 having a minimal capacitance, while the positive bias applied to erase gate 215 results in erase gate 215 having a capacitance $C_3$. With bias conditions, the coupling ratio of cell 200 during erasing operations is $C_2/(C_2+C_3)$. Thus, by minimizing the width of erase gate 215, the coupling ratio may be maximized during erasing operations. Thus, the employment of erase gate 215 in cell 200 allows an increased read speed to be attained without undesirably increasing the size of cell 200 and/or requiring higher erase voltages.

Where it is desired to read cell 200, source 208 and N-well 12 are held at Vcc while select gate 220 is grounded. Control gate 226 is held at a voltage of approximately $V_{cc}$ −2V, and a read voltage of approximately $V_{cc}$ −2V is applied to bit line BL. Cell 200 will conduct channel current only if cell 200 is programmed, i.e., only if there is negative charge stored in floating gate 218. Thus, since a read current flows through cell 200 when floating gate 218 is negatively charged, a programmed cell 200 does not suffer from read disturb problems characteristic of conventional N-channel EEPROM or flash cells. When cell 200 is in an erased state, the voltage on floating gate 218 is always less than the voltage on drain 210. In this manner, cell 200 does not exhibit read disturb problems when in an erased state.

Acceptable ranges for the above-described reading, erasing, and programming bias conditions for cell 200 are provided below in Table 13.

TABLE 13

| | Electrical bias conditions | | | | | |
|---|---|---|---|---|---|---|
| Mode | Bit Line | Select Gate | Source | N-well | Control Gate | Erase Line |
| Program | 0V | 0V | 5–8V | 5–8V | ramped from 0V to 12V | 5–8V |

TABLE 13-continued

Electrical bias conditions

| Mode | Bit Line | Select Gate | Source | N-well | Control Gate | Erase Line |
|---|---|---|---|---|---|---|
| Erase | 0V | 0V | 0V | 3–13V | –3 to –13V | 3–13V |
| Read | less than Vcc | 0V | Vcc | Vcc | 0 to Vcc | float or 0V |

It is to be noted that the advantages described above with respect to cell 10 realized by employing a P-channel memory cell structure which is programmed by hot electron injection and erased by electron tunneling are equally applicable to the embodiments illustrated in FIGS. 15–20.

Figure 21:
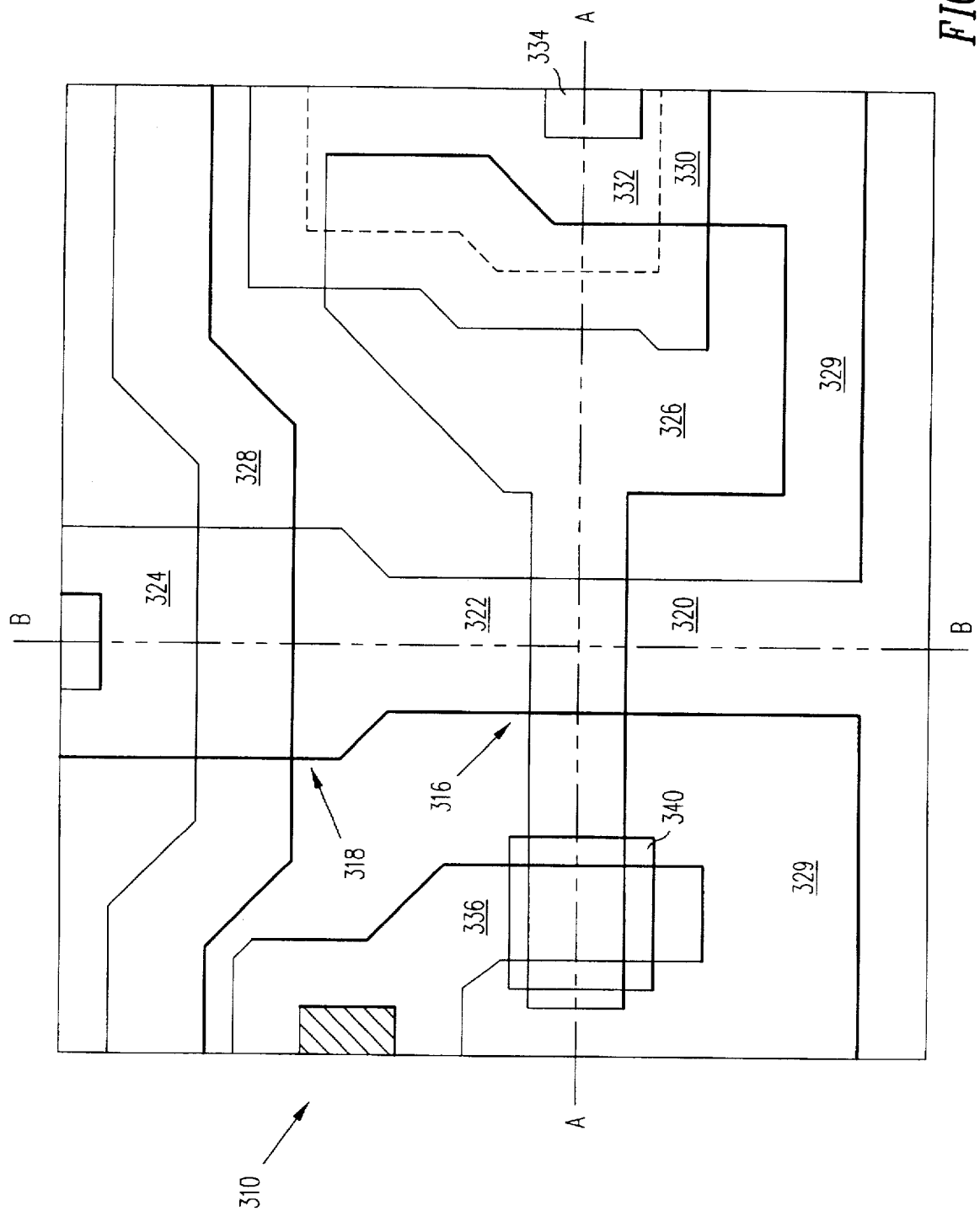
FIG. 21 is a top view of a PMOS single-poly non-volatile memory cell in accordance with the present invention.
Figure 22A:
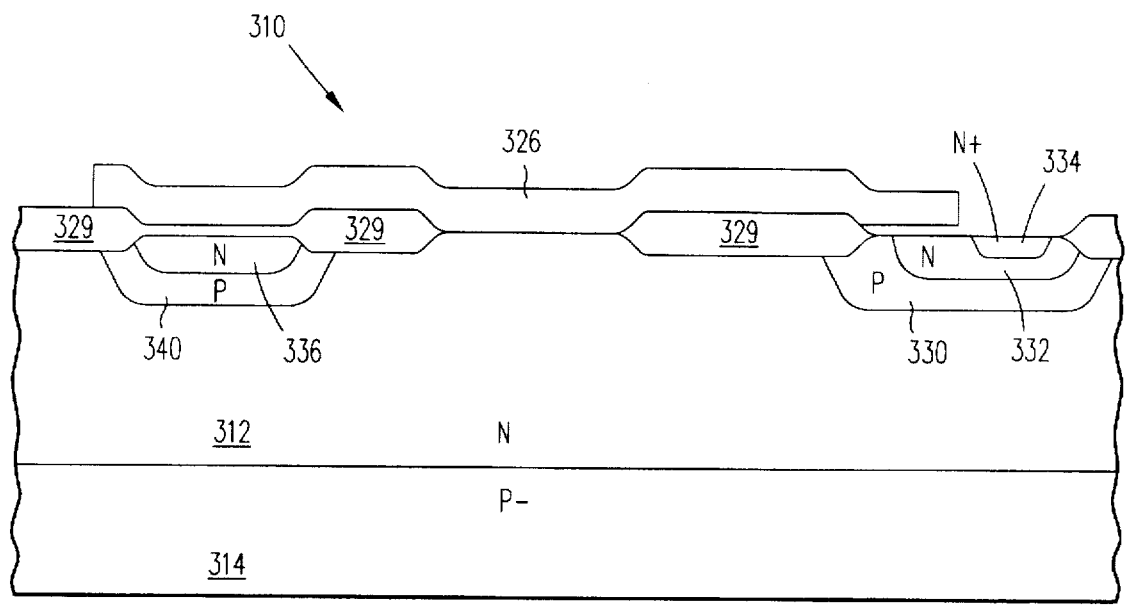
FIG. 22A is a cross-sectional view of the cell of FIG. 21 taken along line A—A.
Figure 23:
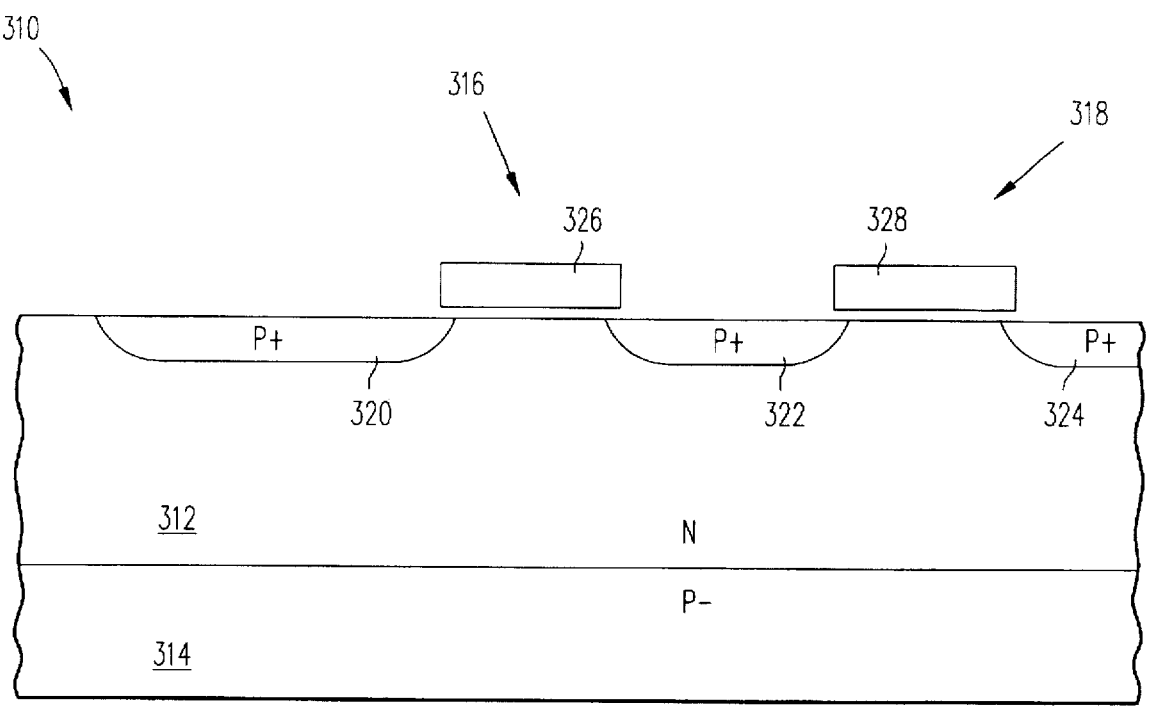
FIG. 23 is a cross-sectional view of the cell of FIG. 21 taken along line B—B.

In accordance with yet another embodiment of the present invention, a PMOS single-poly non-volatile memory cell includes in a portion of the active region thereof a diffusion region which serves as an erase gate for the memory cell. Referring now to FIGS. 21, 22A, and 23, a P-channel single-poly cell 310 is formed in an N-well 312 provided within a P-type substrate 314 and includes a P-channel storage transistor 316 and a P-channel select transistor 318 (FIG. 23). In the description that follows, like components are similarly labeled. In some embodiments, N-well 312 has a sheet resistance of approximately 700–1200 Ω/□ and P-type substrate 14 has a resistivity of approximately 5–100 Ω-cm. In FIG. 23, P+ diffusion region 320 serves as the source for storage transistor 316, P+ diffusion region 322 serves as both the drain for storage transistor 316 and the source for select transistor 318, and P+ diffusion region 324 serves as the drain for select transistor 318. Polysilicon gates 326 and 328 serve as the floating gate and select gate, respectively, of cell 310. Field oxide regions 329 define the active regions of cell 310.

Storage transistor 316 includes a P-type diffusion region 330 (FIG. 22A) formed within N-well 312, where in some embodiments P-type diffusion region 330 has a sheet resistance of approximately 100–500 Ω/□. An N-type diffusion region 332 having in some embodiments a sheet resistance of approximately 100–300 Ω/□ is formed within P-type diffusion region 330 and serves as the control gate for storage transistor 316. An N+ contact region 334 formed within control gate 332 allows for the coupling of voltages to control gate 332. A layer of tunnel oxide (not shown for simplicity) approximately 70–100 Å thick is provided between N-well 312 and floating gate 326.

To program cell 310 i.e. to charge floating gate 326 of storage transistor 316, N-well 312 is held at approximately ground potential while approximately –6.5V is applied to drain 322 of storage transistor 316. Approximately 10V is provided to control gate 332 via contact 334, while source 320 is allowed to float. The coupling ratio between control gate 332 and floating gate 326 is approximately 50%. Thus, approximately 5V appears on floating gate 326. The voltage differential between floating gate 326 and drain 322 induces Fowler-Nordheim tunneling of electrons from drain 322 to floating gate 326 and also results in band-to-band tunneling induced injection of electrons from a portion of the channel region proximate P+ drain 322 into floating gate 26, thereby charging floating gate 326 and increasing the threshold voltage of storage transistor 316.

Note that the P/N junction formed by P-type diffusion region 330 and N-well 312 is forward biased during programming such that diffusion region 330 is at approximately 0.5V. In this manner, P-type diffusion region 330 provides electrical isolation between N-well 312 and control gate 332 during programming operations, thereby allowing N-well 312 to be at ground potential while control gate 332 is at approximately 10V. Further, since N-well 312 may be held at approximately ground potential during programming, the junction between N-well 312 and P+ drain 322 need only sustain approximately a 6.5 volt differential. This is in marked contrast to conventional single-poly memory cells whose well-to-drain junctions are typically required to sustain 15 volts or more. Minimizing the junction voltage between N-well 312 and P+ drain 322 allows the fabrication of cell 310 to be incorporated into single-poly processes typically used in the fabrication of logic circuitry associated with memory arrays without risk of incurring undesirable junction breakdown conditions.

Cell 310 also includes an N-type diffusion region 336 formed within a P-type diffusion region 340, where N-type diffusion region 336 serves as an erase gate for cell 310 (FIG. 22A). In some embodiments, erase gate 336 has a sheet resistance of approximately 100–300 Ω/□ and P-type diffusion region 340 has a sheet resistance of approximately 100–500 Ω/□. P-type diffusion region 340 electrically isolates erase gate 336 from N-well 312, as discussed below. Note that in other embodiments the conductivity types of erase gate 336 and control gate 332 may be opposite that described above without departing from the scope of the present invention. A layer of tunnel oxide (not shown) approximately 70–100 Å thick is provided between floating gate 326 and erase gate 336.

To erase storage transistor 316, approximately –6.5V is coupled to control gate 332 via contact 334. The P/N junction formed by P-type diffusion region 330 and control gate 332 becomes forward biased, where approximately –5.9V appears on P-type diffusion region 330. Approximately –4.0V is coupled from P-type diffusion region 330 and control gate 332 to floating gate 326. Source 320 is held at a floating potential and N-well 312 is grounded. Approximately 8V is applied to erase gate 336. These voltage conditions facilitate the tunneling of electrons from floating gate 326 to erase gate 336. During erasing, approximately 0.5V is coupled to P-type diffusion region 340, thereby reverse biasing the P/N junction formed by P-type diffusion region 340 and erase gate 336. In this manner, P-type diffusion region 340 isolates erase gate 336 from N-well 312 and prevents a current from flowing across from erase gate 336 to N-well 312.

The electrical isolation provided by P-type diffusion region 340 thus allows N-well 312 to remain at ground potential during erasing without an undesirable current flow from erase gate 336 to N-well 312. Thus, by minimizing the voltage differential between N-well 312 and P+ drain 322 during erasing, cell 310 may be fabricated using the same process flow used in constructing associated logic circuitry for cell 310. Accordingly, cell 310 and its associated logic circuitry may be easily fabricated on the same chip, thereby saving time, expense, and space.

As mentioned above, cell 310 utilizes Fowler-Nordheim tunneling for erasing operations and utilizes a combination of Fowler-Nordheim tunneling and hot electron injection for programming operations. As a result, cell 310 requires relatively low programming and erase voltages (10 and 8V, respectively) and, thus, consumes little power during programming and erasing operations.

Cell 310 may be read by applying approximately 0.7V to P+ drain 324 of select transistor 318 (i.e., the bit line) and approximately 3V to control gate 332, P+ source 320, and N-well 312. Erase gate 336 may either be floating or held at approximately 3V. Note that cell 310 conducts a read current only if programmed, i.e., only if there is negative charge stored in floating gate 326. Thus, since a read current flows through cell 310 only when floating gate 326 is negatively charged, a programmed cell 10 does not suffer from read disturb problems characteristic of conventional N-channel memory cells such as flash and EEPROM. When cell 310 is in an erased state, the voltage on floating gate 326 is always less than the voltage on drain 322. In this manner, cell 310 does not exhibit read disturb problems when in an erased state. Table 14 below summarizes the voltage conditions for programming, erasing, and reading cell 310.

TABLE 14

| operation | source 320 | drain 322 | control gate 332 | erase gate 336 | N-well 312 |
|---|---|---|---|---|---|
| program | float | −6.5 V | 10 V | 0 V | 0 V |
| erase | float | float | −6.5 V | 8 V | 0 V |
| read | 3 V | 0.7 V | 3 V | float | 3 V |

In high endurance applications the structure cell 310 may be problematic. Applicant suspects that during the fabrication of cell 310, nitride etching steps may create what is termed in the semiconductor industry as "white ribbons" in regions of the tunnel oxide proximate to field oxide regions. These white ribbons may begin to degrade the performance of cell 310 after repeated programming and erasing operations. Thus, in some embodiments in accordance with the present invention where cell 310 may be programmed and erased numerous times, an erase window is formed between erase gate 336 and floating gate 326.

Figure 24:
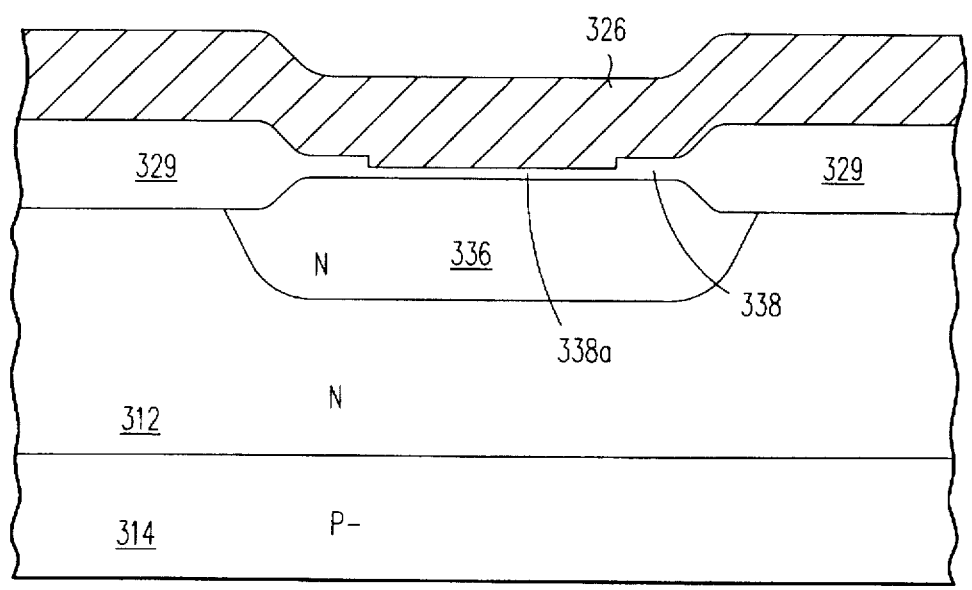
FIG. 24 is a cross-sectional view of a portion of a PMOS single-poly cell in accordance with another embodiment of the present invention.

Referring to FIG. 24, a layer of oxide 338 approximately 200 Å thick is provided between floating gate 326 and erase gate 336. A window portion 338a approximately 70–100 Å thick is then formed within oxide layer 338, as shown in FIG. 24, to facilitate electron tunneling from floating gate 326 and erase gate 336. The thicker oxide layer 338 prevents the formation of white ribbons during fabrication of cell 310 and, therefore, increases durability and reliability of cell 310.

Figure 22B:
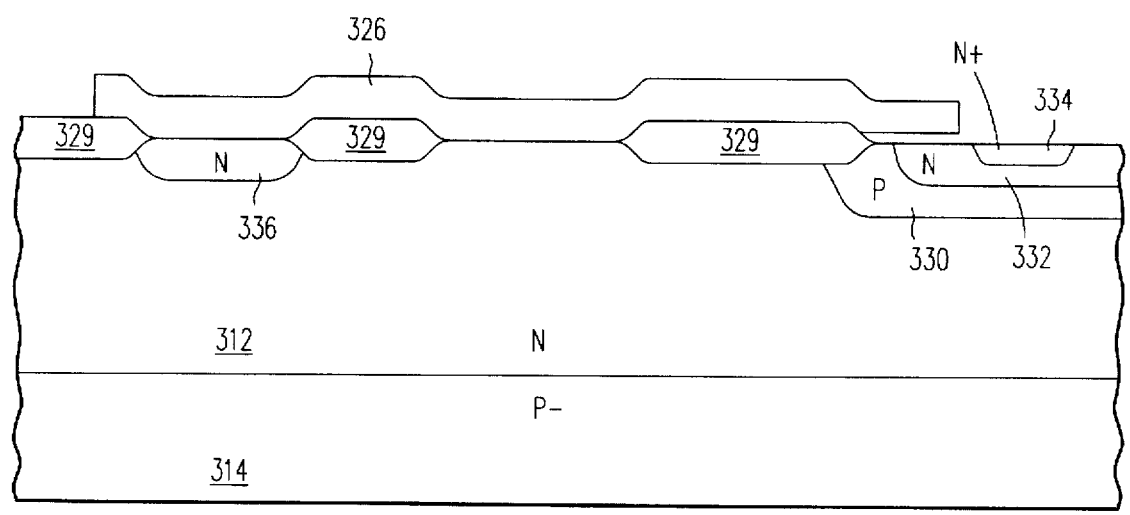
FIGS. 22B–22D are cross-sectional view of cells in accordance with other embodiments of the present invention.

In other embodiments, the erase gate structure may be slightly modified. In one such embodiment shown in FIG. 22B, P-type diffusion region 340 may be eliminated, in which case erase gate 336 is formed directly within N-well 312. Although saving valuable silicon real estate, the absence of the electrically isolating diffusion region 340 results in the potential of erase gate 336 being the same as the potential of N-well 312. Accordingly, bit mode and byte mode erasing are not possible in the embodiment of FIG. 22B since the erase gates 336 of each cell 310 formed within N-well 312 will necessarily be at the same potential, i.e., the potential of N-well 312.

Figure 22C:
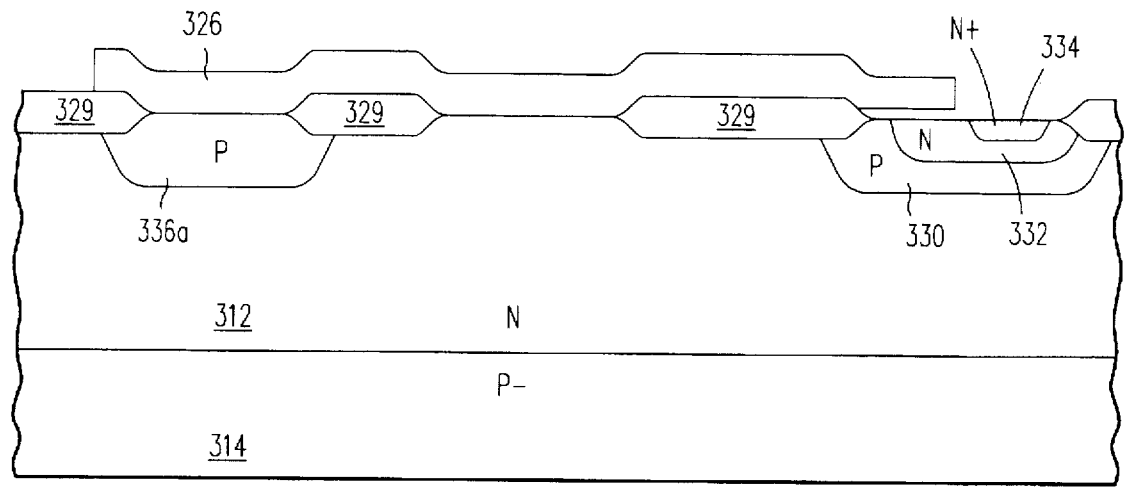
Figure 22D:
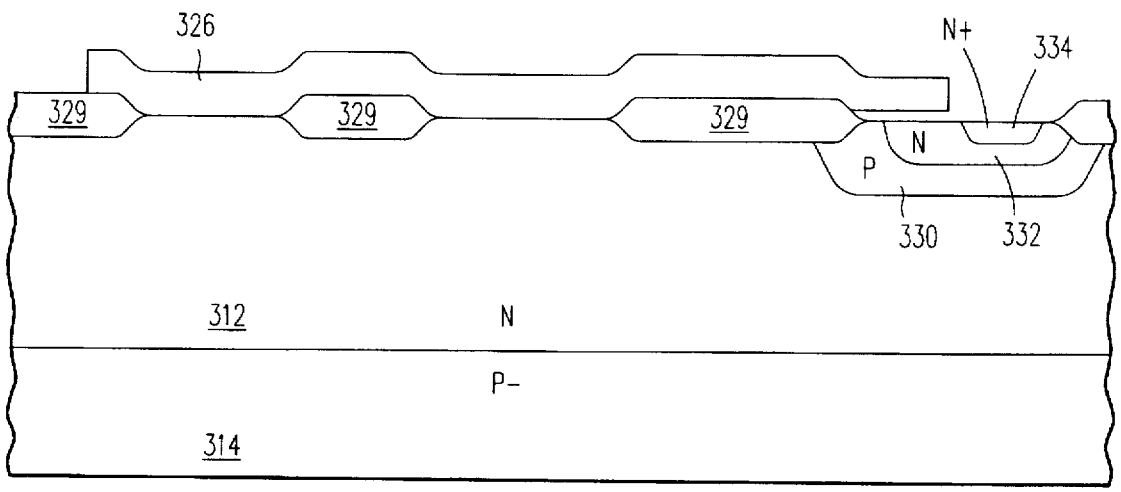

FIGS. 22C and 22D show two further embodiments of the present invention. In FIG. 22C, erase gate 336a is a P-type diffusion region, as opposed to an N-type diffusion region. Note that in this embodiment the P/N junction formed by erase gate 336a and N-well 312 may be easily forward biased which, in turn, would undesirably result in a current flow from erase gate 336a to N-well 312. In FIG. 22D, the erase gate structure 336 is altogether eliminated.

In other embodiments where size is of more significance than read speed, the channel width of storage transistor 316 may be reduced from its normal width of approximately 1–5 μm to as little as approximately 0.3–0.7 μm, and erase gate 336 may be eliminated. In such embodiments, cell 310 is programmed, erased, and read as described above except that the electrons will tunnel from floating gate 326 to P+ drain 322, source 320, and N-well 312. The reduction in channel width coupled with the elimination of erase gate 336 allows for up to a 30% reduction in cell size. Of course, this reduction in cell size comes at the expense of slower read speeds. Applicant has determined that such a reduction in cell size is warranted and will have a minimal effect upon performance speeds where read currents are less than approximately 50 μA. Acceptable voltage conditions for programming, erasing, and reading such a reduced-size cell are provided below in Table 15.

TABLE 15

| operation | source 320 | drain 322 | control gate 332 | N-well 312 |
|---|---|---|---|---|
| program | float | −6.5 V | 10 V | 0 V |
| erase | 8 V | 8 V | −6.5 V | 8 V |
| read | 3 V | 2 V | 3 V | 3 V |

Note that in still other embodiments, cell 310 may be programmed by coupling a sufficiently positive voltage such as, for instance, 0V to floating gate 326 via control gate 332 while applying a negative bias voltage such as, for instance, −8V to erase gate 336 to facilitate the tunneling of electrons from erase gate 336 to floating gate 326. In a similar manner, in some embodiments cell 310 may be erased by causing the tunneling of electrons from floating gate 326 to portions of N-well 312 proximate P+ source 320 and P+ drain 322 of storage transistor 316.

Figure 25:
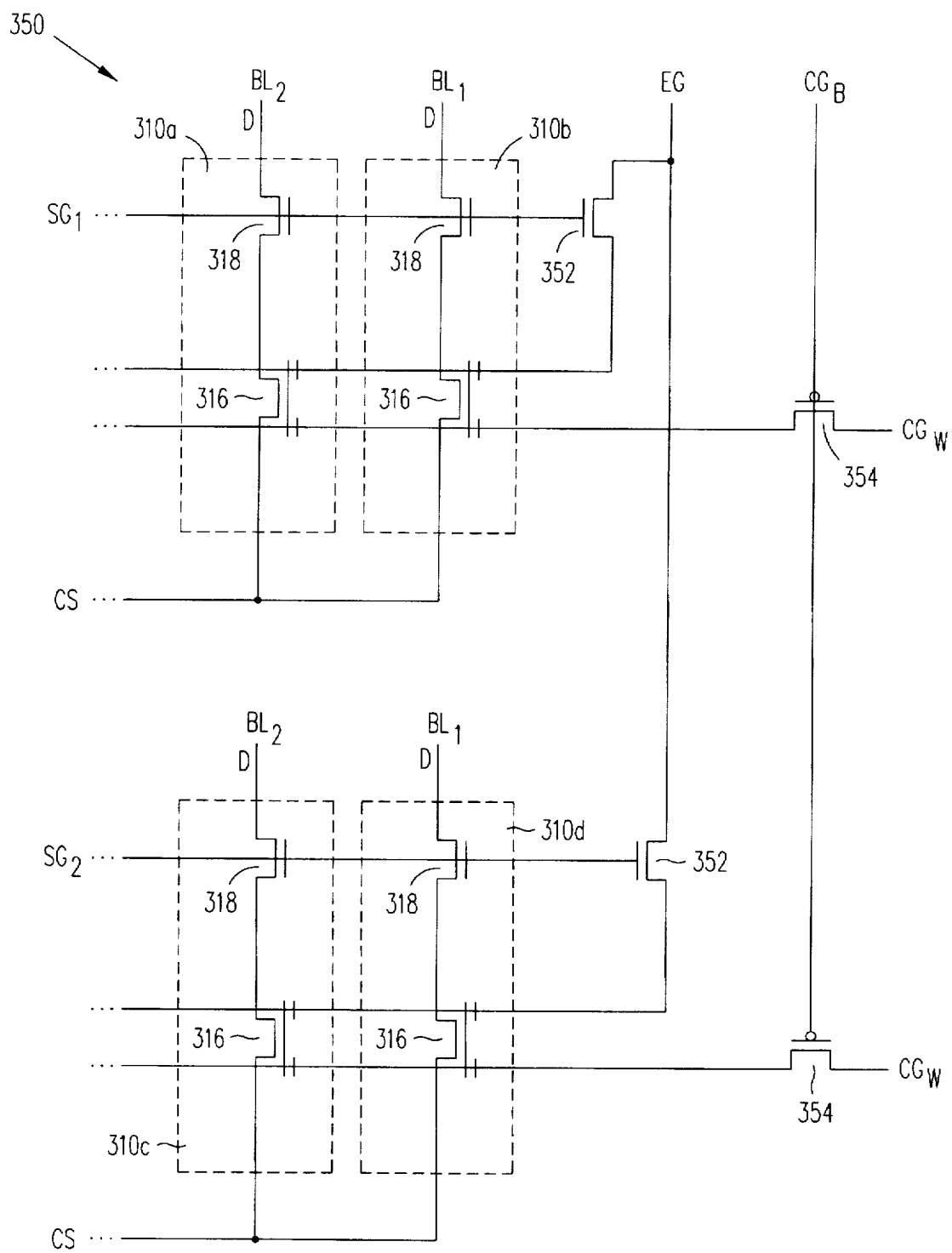
FIG. 25 is a schematic diagram of a memory array structure employing PMOS single-poly cell the present invention.

Cell 310 may also be incorporated into a memory array 350, as shown in FIG. 25. It is to be understood that array 350 is shown in FIG. 25 as including only two words (i.e. rows) of two bits (i.e. columns) for simplicity only. In actual embodiments, array 350 will normally include many words of many bits. Each of cells 310a–310d is formed in a common N-well such as N-well 312 and each has its P+ source 320 tied to a common source node CS. P+ drain 324 of each select transistor 318 is coupled to an associated one of bit lines BL. Note that cells 310a–310d are depicted in FIG. 25 using a two-gate notation to illustrate the presence of control gate 326 and erase gate 336. The select gates 328, i.e. the gates of select transistors 318, in a common row are coupled to the gate of an erase select transistor 352 which has a source coupled to an erase gate potential EG and a drain coupled to erase gates 336 of each of cells 10 in a common row. The control gates 326 of each of cells 310 in a common row are coupled to the drain of a control gate select transistor 354 which has a gate coupled to a control gate bit line potential $CG_B$ and a source coupled to a control gate word line potential $CG_W$.

To program, for instance, cell 310a, bit line $BL_1$ is held at approximately −6.5V, all other bit lines (e.g. $BL_2$) are left floating, and erase gate select potential EG is held at 0V. Select gate potential $SG_1$ is held at approximately −8.5V and, in turning on associated select transistors 318 and associated erase transistor 352, pulls drain 322 and erase gate 336 of selected cell 310a to approximately −6.5V and 0V, respectively. Drains 322 of unselected cells 310 (e.g. cell 310b) are floating. Control gate bit line $CG_B$ is pulled to ground potential to turn on control gate select transistors 354. Control gate word line $CG_W$ associated with cell 310a is pulled to approximately 10V, thereby coupling approximately 5V to floating gate 326 of selected cell 310a, as described above. In this manner, cells 310 of array 350 may be programmed in a bit-by-bit fashion. A summary of voltage conditions for programming, erasing, and reading cells 310 of array 350 is provided below in Table 16, where F denotes a floating potential.

TABLE 16

| mode | cell | location | SG | BL | $CG_B$ | $CG_W$ | EG | source | N-well |
|---|---|---|---|---|---|---|---|---|---|
| program | selected | | −8.5 | −6.5 | 0.5 | 8 | F | F | 0 |
| program | un-selected | same row | 0.5 | −6.5 | 0.5 | F | F | F | 0 |
| program | un-selected | same column | −8.5 | F | 8 | 8 | F | F | 0 |
| erase | selected | | 10 | F | −8.5 | −6.5 | 8 | F | F |
| erase | un-selected | same row | 0.5 | F | −8.5 | F | 8 | F | F |
| erase | un-selected | same column | 10 | F | 0.5 | −6.5 | F | F | F |
| read | selected | | 0.5 | 0.7 | 0.5 | 3 | F | 3 | 3 |
| read | un-selected | same row | 3 | 0.7 | 0.5 | 3 | F | 3 | 3 |
| read | un-selected | same column | 0.5 | F | 0.5 | 3 | F | 3 | 3 |

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

I claim:

1. A P-channel non-volatile memory cell, comprising:

a P+ source and a P+ drain formed in an N-well;

a channel extending between said source and said drain;

a floating gate overlying said channel;

a first diffusion region formed in said N-well and underlying a first portion of said floating gate, said first diffusion region serving as a control gate of said cell; and a second diffusion region formed in said N-well and underlying a second portion of said floating gate, said second diffusion region serving as an erase gate of said cell, wherein said memory cell is programmed by applying approximately −6.5 volts to said drain, applying approximately 10 volts to said control gate, coupling said source to a floating potential, and grounding said N-well.

2. A P-channel non-volatile memory cell, comprising:

a P+ source and a P+ drain formed in an N-well;

a channel extending between said source and said drain;

a floating gate overlying said channel;

a first diffusion region formed in said N-well and underlying a first portion of said floating gate, said first diffusion region serving as a control gate of said cell; and a second diffusion region formed in said N-well and underlying a second portion of said floating gate, said second diffusion region serving as an erase gate of said cell, wherein said memory cell is erased by applying approximately −6.5 volts to said control gate, applying approximately 8 volts to said erase gate, grounding said N-well, and coupling said source and said drain to a floating potential.

3. A P-channel non-volatile memory cell, comprising:

a P+ source and a P+ drain formed in an N-well;

a channel extending between said source and said drain;

a floating gate overlying said channel;

a first diffusion region formed in said N-well and underlying a first portion of said floating gate, said first diffusion region serving as a control gate of said cell;

a second diffusion region formed in said N-well and underlying a second portion of said floating gate, said second diffusion region serving as an erase gate of said cell; and a third diffusion region formed in said N-well, said third diffusion region being of a conductivity type opposite that of said erase gate, wherein said erase gate is formed within said third diffusion region whereby said third diffusion region electrically isolates said erase gate from said N-well.

4. The memory cell of claim 3, wherein said memory cell is programmed by the tunneling of electrons from said drain to said floating gate and by the injection of hot electrons from a portion of said channel proximate said drain to said floating gate.

5. The memory cell of claim 3, wherein said memory cell is erased by the tunneling of electrons from said floating gate to said erase gate.

6. The memory cell claim 3, wherein said control gate is N-type.

7. The memory cell claim 3, wherein said erase gate is P-type.

8. The memory cell claim 3, wherein said erase gate is N-type.

9. The memory cell claim 3, wherein said third diffusion region is P-type.

10. The memory cell claim 3, wherein said third diffusion region is N-type.

11. The memory cell of claim 3, further comprising a fourth diffusion region formed in said N-well, said fourth diffusion region being of a conductivity type opposite that of said control gate, wherein said control gate is formed within said fourth diffusion region whereby said fourth diffusion region electrically isolates said control gate from said N-well.

12. The memory cell of claim 11, wherein said fourth diffusion region is P-type.

13. The memory cell of claim 11, wherein said third diffusion region is N-type.

14. The memory cell of claim 11, wherein said third diffusion region is P-type.

15. A P-channel non-volatile memory cell, comprising:

a P+ source and a P+ drain formed in an N-well;

a channel extending between said source and said drain;

a floating gate overlying said channel;

a first diffusion region formed in said N-well and underlying a first portion of said floating gate, said first diffusion region serving as a control gate of said cell;

a second diffusion region formed in said N-well and underlying a second portion of said floating gate, said second diffusion region serving as an erase gate of said cell; and a third diffusion region formed in said N-well, said third diffusion region being of a conductivity type opposite that of said control gate, wherein said control gate is formed within said third diffusion region whereby said third diffusion region electrically isolates said control gate from said N-well.

16. The memory cell of claim 15, wherein said third diffusion region is P-type.

17. A P-channel non-volatile memory cell, comprising:

a P+ source and a P+ drain formed in an N-well;

a channel extending between said source and said drain;

a floating gate overlying said channel;

a first diffusion region formed in said N-well and underlying a first portion of said floating gate, said first diffusion region serving as a control gate of said cell; and a second diffusion region formed in said N-well and underlying a second portion of said floating gate, said second diffusion region serving as an erase gate of said cell, wherein said memory cell is read by applying approximately 0.7 volts to said drain and applying approximately 3 volts to said source, said control gate, and said N-well.

18. The memory cell of claim 17, wherein said memory cell is read by further connecting said erase gate to a floating potential.

19. The memory cell of claim 17, wherein said memory cell is read by further applying approximately 3 volts to said erase gate.

* * * * *

UNITED STATES PATENT AND TRADEMARK OFFICE
CERTIFICATE OF CORRECTION

PATENT NO. : 5,761,121
DATED : Jun. 2, 1998
INVENTOR(S) : Shang-De Ted Chang

It is certified that error appears in the above-identified patent and that said Letters Patent is hereby corrected as shown below:

Column 1, line 27, delete "the control gate" and insert --a control gate--.
Column 13, line 47, delete "electron" and insert --electrons--.
Column 15, line 63, delete "26" and insert --326--.
Column 17, line 23, in the last row of TABLE 14, after "float" insert --or 3 V--.

Signed and Sealed this

Twenty-fifth Day of May, 1999

Q. TODD DICKINSON

Attest:

Attesting Officer    Acting Commissioner of Patents and Trademarks